(12) United States Patent
Scarbrough et al.

(10) Patent No.: US 11,398,427 B2
(45) Date of Patent: *Jul. 26, 2022

(54) INTEGRATED ASSEMBLIES AND METHODS OF FORMING INTEGRATED ASSEMBLIES

(71) Applicant: Micron Technology, Inc., Boise, ID (US)

(72) Inventors: Alyssa N. Scarbrough, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 147 days.

This patent is subject to a terminal disclaimer.

(21) Appl. No.: 16/872,691

(22) Filed: May 12, 2020

(65) Prior Publication Data

US 2021/0358843 A1 Nov. 18, 2021

(51) Int. Cl.
| | |
|---|---|
| *H01L 27/11582* | (2017.01) |
| *H01L 23/522* | (2006.01) |
| *H01L 27/11524* | (2017.01) |
| *H01L 27/11565* | (2017.01) |
| *H01L 27/1157* | (2017.01) |
| *H01L 27/11573* | (2017.01) |
| *H01L 27/11519* | (2017.01) |

(Continued)

(52) U.S. Cl.
CPC ...... *H01L 23/5226* (2013.01); *H01L 23/5283* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC .................................................. H01L 27/11582
See application file for complete search history.

(56) References Cited

U.S. PATENT DOCUMENTS

| | | | |
|---|---|---|---|
| 10,103,169 | B1 | 10/2018 | Ge et al. |
| 10,115,732 | B2 | 10/2018 | Yu et al. |

(Continued)

OTHER PUBLICATIONS

WO PCT/US2021/027728 Srch Rpt, dated Aug. 2, 2021, Micron Technology, Inc.

(Continued)

*Primary Examiner* — Christopher A Johnson
(74) *Attorney, Agent, or Firm* — Wells St. John P.S.

(57) ABSTRACT

Some embodiments include a method in which a first stack of alternating first and second levels is formed. At least some of the first and second levels are configured as steps. Each of the steps has one of the second levels and one of the first levels. An etch-stop material and a liner are formed over the stack. A first material is formed over the etch-stop material. Openings are formed to extend through the first material to the etch-stop material. Sacrificial material is formed within the openings. A second stack is formed over the first stack. A second material is formed over the first material. Conductive layers are formed within the first levels. Additional openings are formed to extend to the sacrificial material, and are then extended through the sacrificial material to the conductive layers within the steps. Some embodiments include integrated assemblies.

22 Claims, 24 Drawing Sheets

(51) Int. Cl.
*H01L 27/11556* (2017.01)
*H01L 23/528* (2006.01)
*H01L 27/11529* (2017.01)

(56) References Cited

U.S. PATENT DOCUMENTS

| | | | |
|---|---|---|---|
| 2011/0151667 A1* | 6/2011 | Hwang | H01L 23/5226 438/667 |
| 2013/0330482 A1 | 12/2013 | Leu et al. | |
| 2017/0025437 A1 | 1/2017 | Walker | |
| 2017/0110365 A1 | 4/2017 | Oh | |
| 2017/0117222 A1 | 4/2017 | Kim et al. | |
| 2017/0294384 A1 | 10/2017 | Chen | |
| 2019/0096810 A1 | 3/2019 | Zhu | |
| 2019/0326166 A1 | 10/2019 | Nam | |
| 2020/0365617 A1* | 11/2020 | Ahn | H01L 27/11573 |
| 2021/0358805 A1 | 11/2021 | Hopkins | |

OTHER PUBLICATIONS

WO PCT/US2021/027728 Wtn Opn, dated Aug. 2, 2021, Micron Technology, Inc.
U.S. Appl. No. 16/872,598, filed May 12, 2020, by Hopkins et al.

* cited by examiner

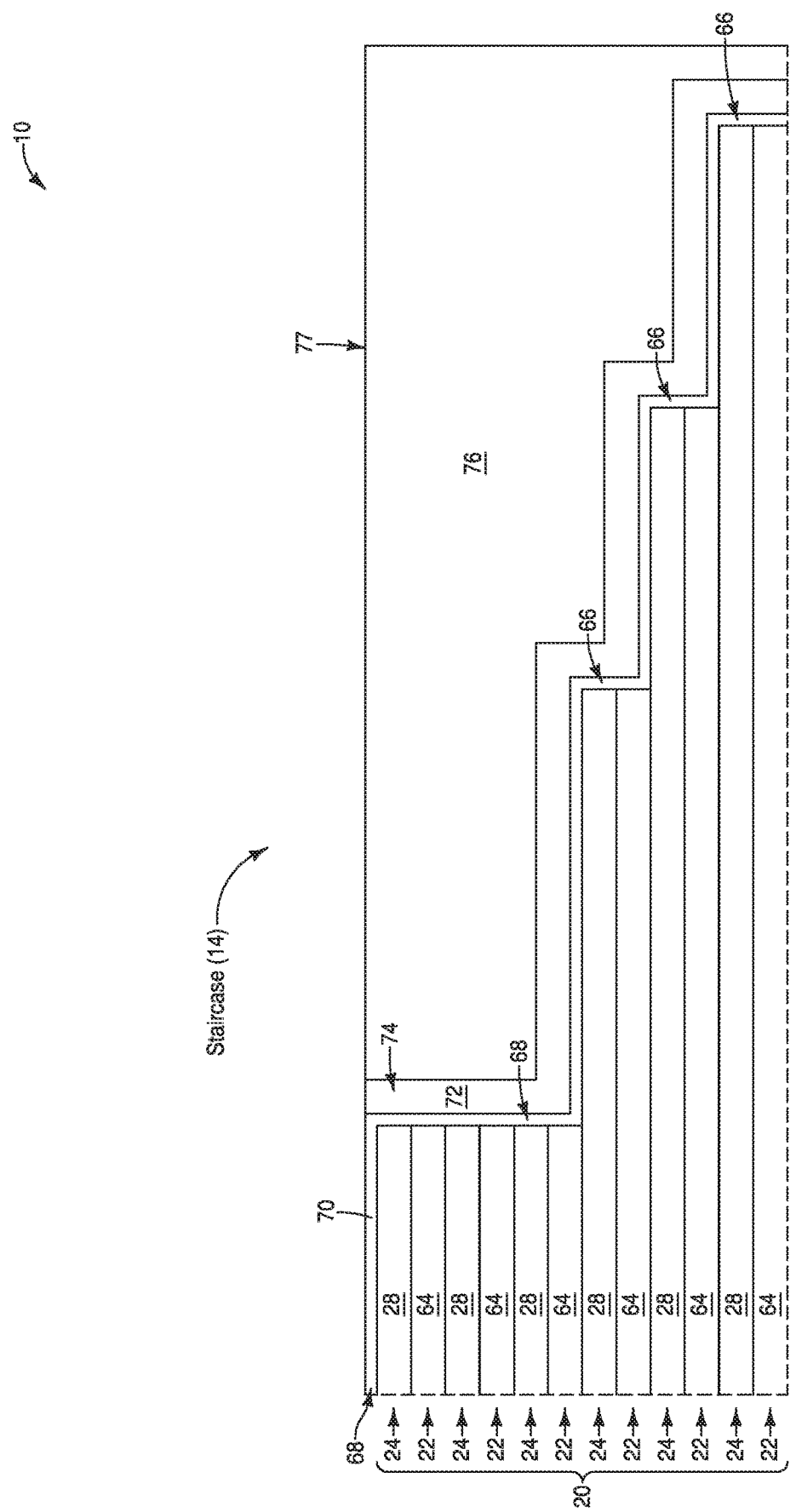

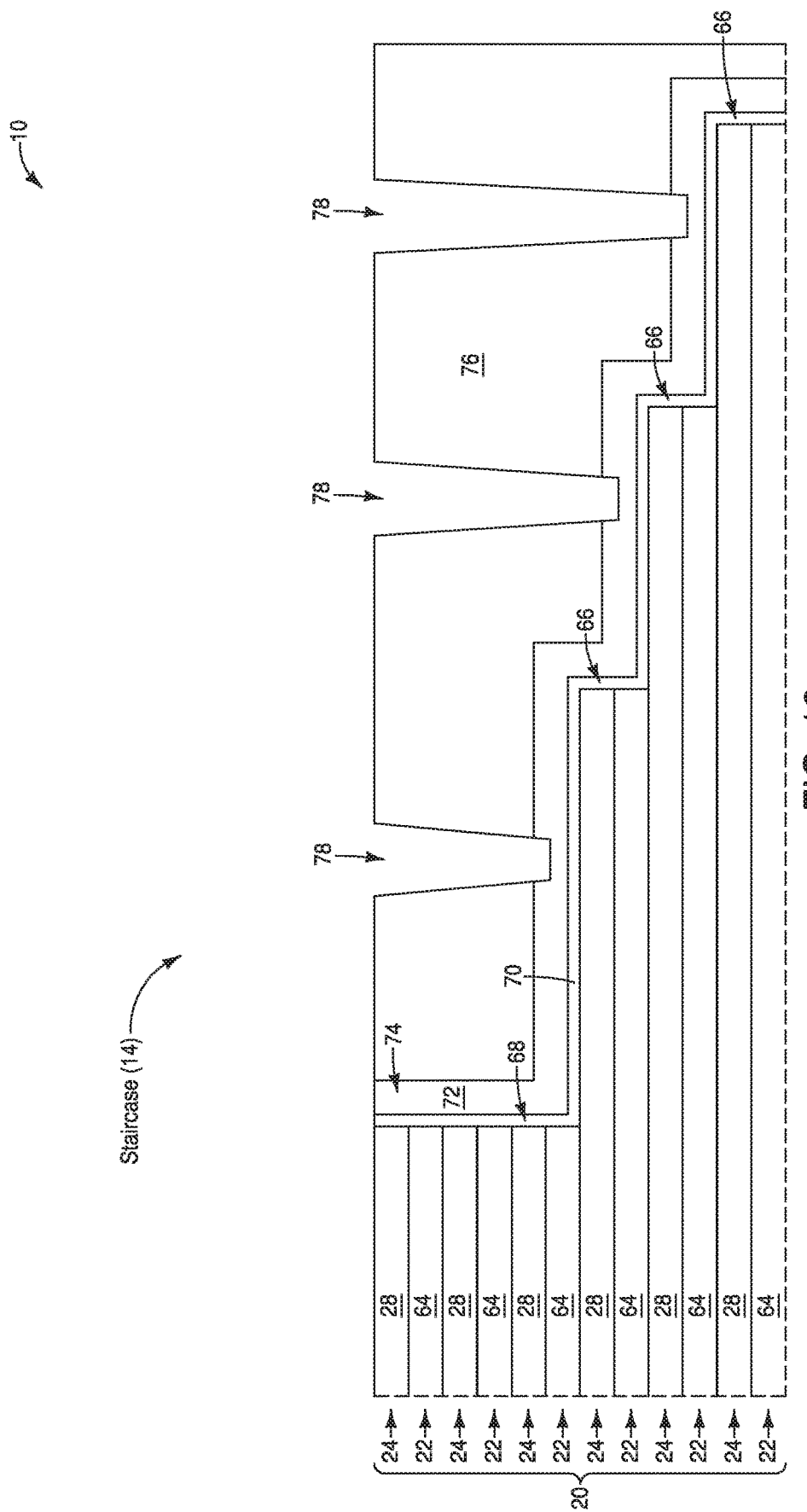

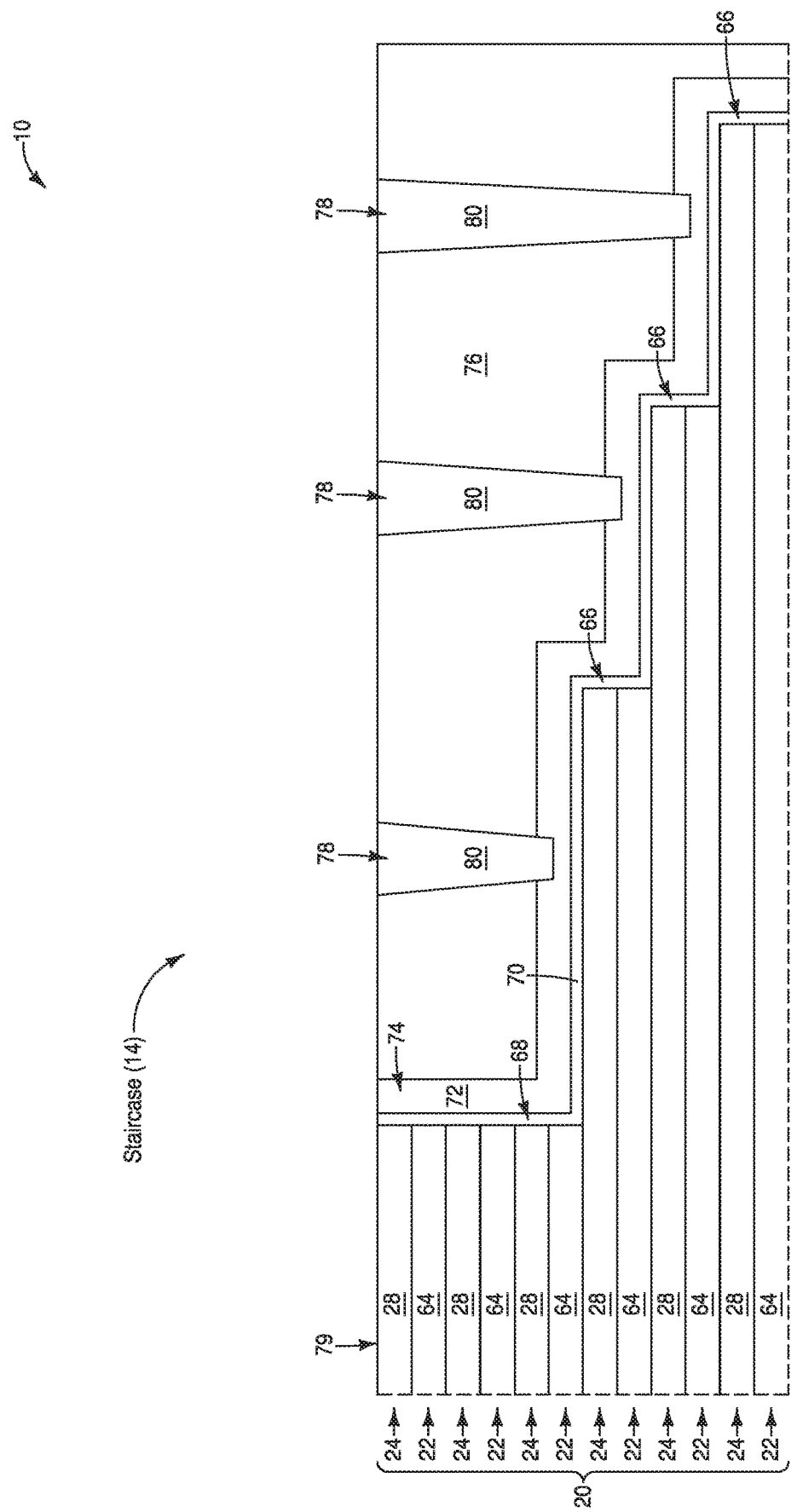

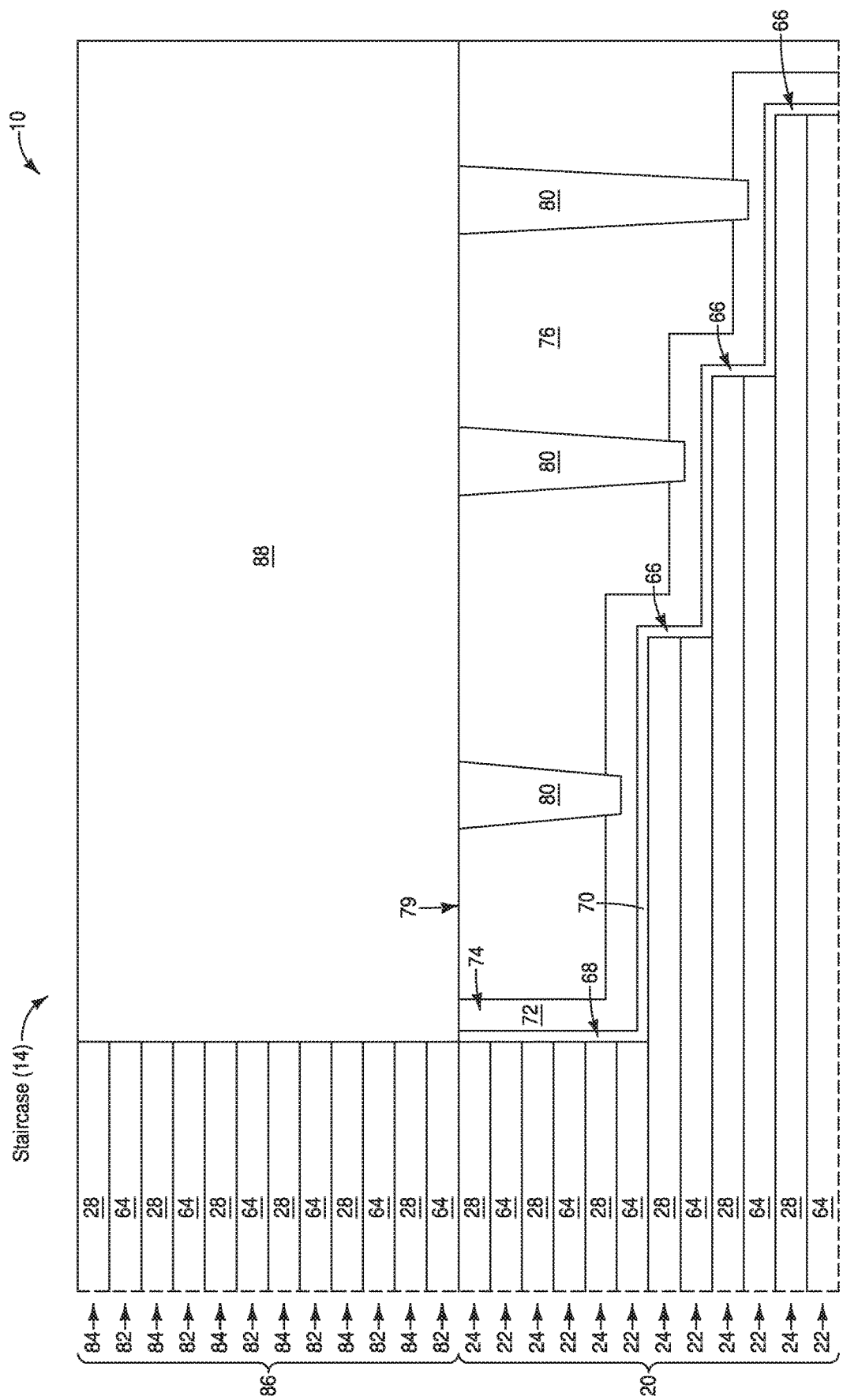

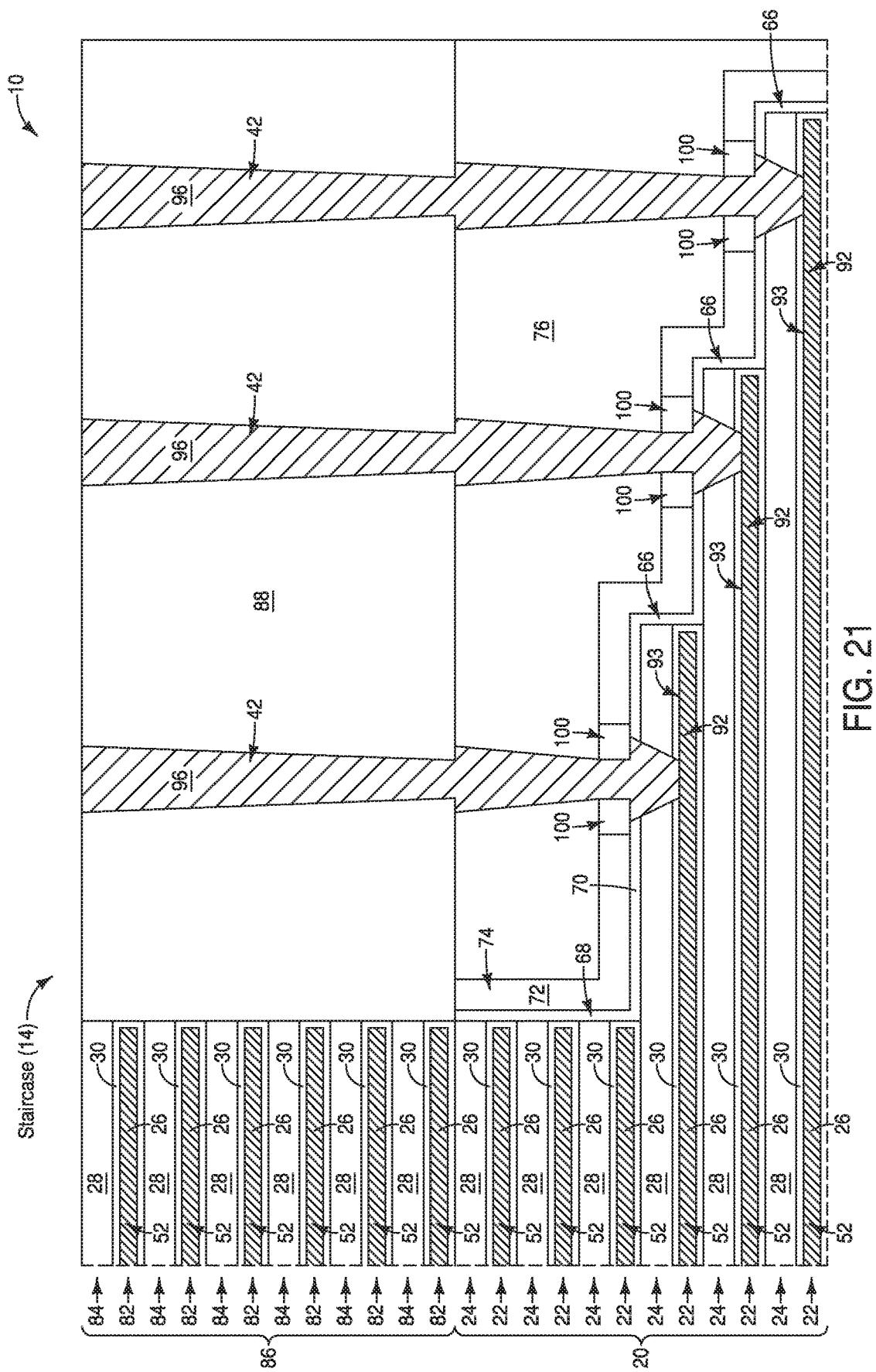

INTEGRATED ASSEMBLIES AND METHODS OF FORMING INTEGRATED ASSEMBLIES

TECHNICAL FIELD

Integrated assemblies (e.g., memory arrangements), and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile $column_I$, tile $column_j$ and tile $column_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device (memory array) 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

FIGS. 5 and 6 describe a general layout of a conventional integrated assembly 10, with FIG. 5 showing a top down view of regions of the assembly and FIG. 6 showing a cross-sectional side view of the regions of the assembly.

Referring to FIG. 5, the assembly 10 includes a memory array region 12 (Memory Array) proximate a staircase region 14 (Staircase).

The memory array region 12 includes channel-material-pillars 16 arranged in a tightly-packed pattern (e.g., a hexagonally-packed pattern). The channel-material-pillars extend through conductive tiers (described below with reference to FIG. 6). The staircase region 14 includes interconnect regions 18 where electrical contact is made to individual tiers. Each of the interconnect regions may be utilized for establishing interconnects to a specific set of the tiers. For instance, FIG. 5 shows that each of the interconnect regions is utilized for establishing interconnects to eight of the tiers, with one of the regions be utilized for coupling with tiers 1-8, and another of the regions being utilized for coupling with tiers 9-16. Any suitable number of interconnect regions 18 may be utilized, and such interconnect regions may be utilized for coupling with any suitable number of conductive tiers.

FIG. 6 shows a cross-sectional side view of the regions 12 and 14. A stack 20 of alternating first and second levels 22 and 24 extends within the regions 12 and 14. The levels 22 comprise conductive material 26, and the levels 24 comprise insulative material 28. In the shown embodiment, a dielectric barrier material 30 extends along the conductive material 26 of the levels 22.

The levels 22 may be considered to comprise conductive tiers, with such tiers corresponding to the conductive material 26 within such levels. Any suitable number of conductive tiers may be utilized; such as, for example, 8, 16, 32, 64, 128, 256, 512, 1024, etc.

Channel-material-pillars 16 extend through the stack 20 within the memory array region 12. The channel-material-pillars comprise channel material 32 (indicated with stippling). The channel material is spaced from the stack 20 by intervening regions 34. Such regions include charge-blocking material 36, charge-trapping material 38 and gate dielectric material 40.

In the illustrated embodiment, the channel-material-pillars 16 are configured as annular rings surrounding an insulative material 33. Such may be considered to be a hollow channel configuration, with the insulative material 33 being within "hollows" of the channel-material-pillars 16. In other applications, the channel-material-pillars 16 may be solid rather than being hollow.

The staircase region 14 includes conductive interconnects 42 which extend to the conductive material 26 of the individual tiers 22. The conductive interconnects extend through an insulative fill material 44.

A source structure 46 is shown to be under the stack 20 of the memory array region 12. The source structure may or may not also extend to under the stack 20 of the staircase region 14.

The channel material 32 is shown to be electrically coupled with the source structure 46.

Memory cells 48 are along the conductive levels 22 within the memory array region 12; with each of the memory cells including portions of the channel material 32, gate dielectric material 40, charge-trapping material 38, charge-blocking material 36 and gate dielectric material 30. The memory cells also include regions of the conductive material 26 of the conductive tiers 22. The regions of the conductive material 26 within the memory cells 48 may be considered to be gate regions 50. Other regions of the conductive material 26 may be considered to be routing regions (wordline regions) 52 which couple the gate regions with other circuitry. The routing regions 52 extend to the interconnects 42 within the staircase region 14.

A source-side select gate (SGS) 54 may be between the memory cells 48 and the source structure 46.

The channel material 32 may be coupled to a bitline 53 through a drain-side select gate (SGD) 56.

A base 58 supports the structures of the memory array region 12 and the staircase region 14. The base 58 may be part of a semiconductor die. The base 58 may comprise semiconductor material; and may, for example, comprise, consist essentially of, or consist of monocrystalline silicon. The base 58 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 58 may correspond to a semiconductor substrate containing one or more materials associated with integrated circuit fabrication. Such materials may include, for example, one or more of refractory metal materials, barrier materials, diffusion materials, insulator materials, etc.

Logic circuitries 60 and 62 are shown to be supported by the base. Such logic circuitries may comprise, for example, CMOS. In the illustrated application, the logic circuitry 60 comprises sense-amplifier-circuitry (Sense Amplifier), and is electrically coupled with the bitline 53; and the logic circuitry 62 comprises wordline-driver-circuitry (Wordline Driver) and is electrically coupled with the wordline levels 22 through the interconnects 42.

It can be difficult to form the interconnects 42 in the staircase region 14, particularly with respect to very deep tiers due to the high aspect ratios of the deep openings used to reach the deep tiers. It would be desirable to develop improved methods of forming the interconnects 42.

BRIEF DESCRIPTION OF THE DRAWINGS

FIGS. 8-14 are diagrammatic cross-sectional side views of the region of the example structure of FIG. 7 at example sequential process stages of an example method. The process stage of FIG. 8 may follow that of FIG. 7.

FIG. 21 is a diagrammatic cross-sectional side view of the region of the example structure of FIG. 7 at an example process stage of an example method. The process stage of FIG. 21 may follow that of FIG. 18.

DETAILED DESCRIPTION OF THE ILLUSTRATED EMBODIMENTS

Some embodiments include methods of forming interconnects to specific steps within a staircase region of an integrated assembly. Some embodiments include integrated assemblies having interconnects electrically coupled with steps in a staircase region of an integrated assembly. Example embodiments are described with reference to FIGS. 7-21.

Figure 7:
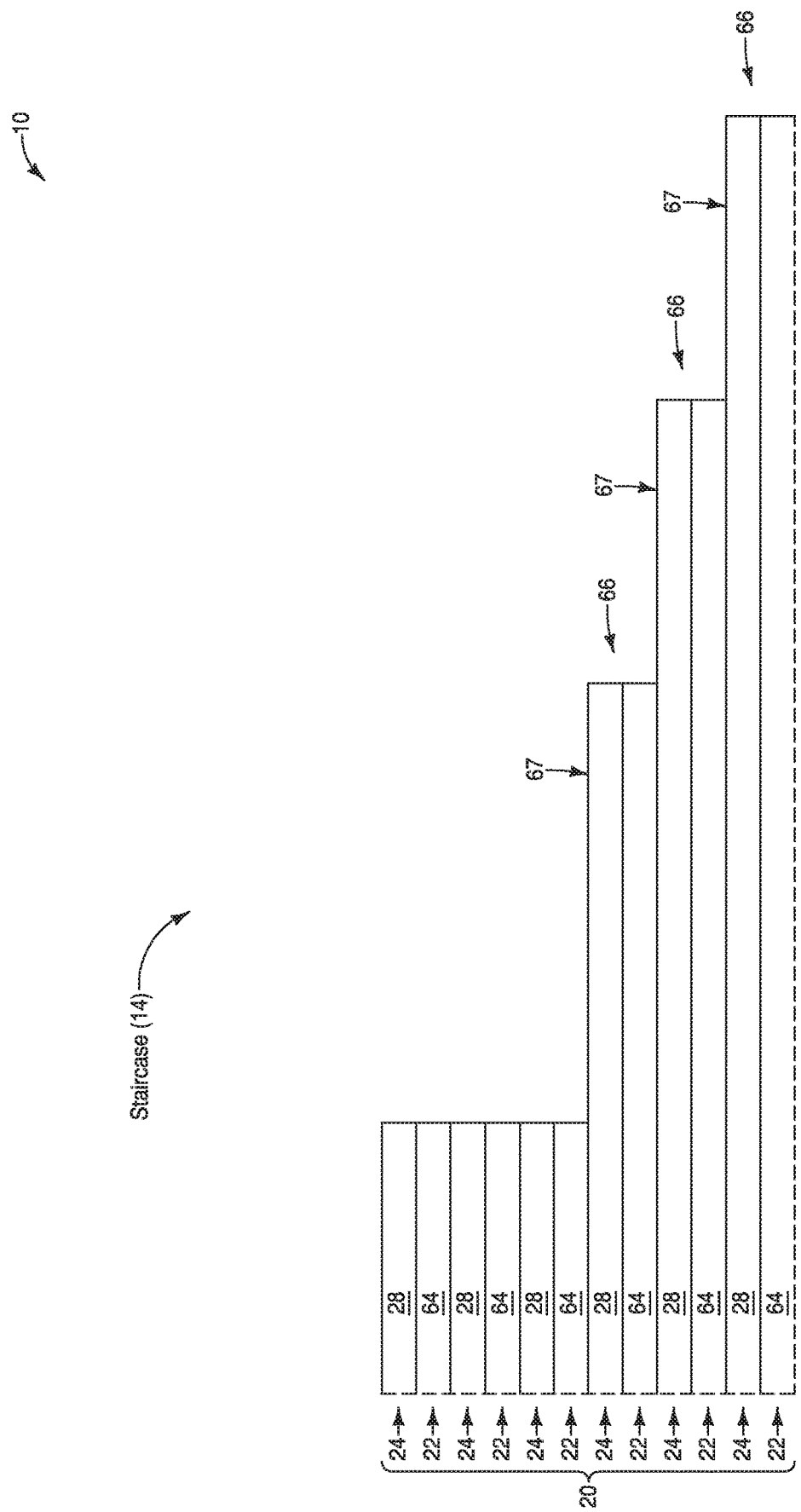
FIG. 7 is a diagrammatic cross-sectional side view of a region of an example structure at an example process stages of an example method.

Referring to FIG. 7, a staircase region 14 of an integrated assembly 10 is illustrated at an example process stage. The staircase region includes a stack 20 of alternating first and second levels 22 and 24. The first levels 22 comprise sacrificial material 64, and the second levels 24 comprise insulative material 28.

The sacrificial material 64 may comprise any suitable composition(s); and in some embodiments may comprise, consist essentially of, or consist of silicon nitride.

The insulative material 28 may comprise any suitable composition(s); and in some embodiments may comprise, consist essentially of, or consist of silicon dioxide.

In some embodiments, the stack 20 may be referred to as a first stack to distinguish it from another stack formed at a subsequent process stage. Also, the sacrificial material 64 may be referred to as a first sacrificial material to distinguish it from other sacrificial materials formed at subsequent process stages.

Some of the first and second levels 22/24 are configured as steps 66. Each of the steps comprises one of the second levels 24 over an associated one of the first levels 22 (i.e., comprises the insulative material 28 over the sacrificial material 64), and has an upper surface 67.

The levels 22 and 24 may be of any suitable thicknesses; and may be the same thickness as one another, or different thicknesses relative to one another. In some embodiments, the levels 22 and 24 may have vertical thicknesses within a range of from about 10 nanometers (nm) to about 400 nm.

The stack 20 may have any suitable number of the first and second levels 22 and 24. For instance, in some embodiments the stack 20 may have 8 of the first levels, 16 of the first levels, 32 of the first levels, 64 the first levels, 512 of the first levels, 1024 of the first levels, etc.; with such first levels ultimately becoming conductive tiers analogous to those described above with reference to FIG. 6.

Figure 7A:
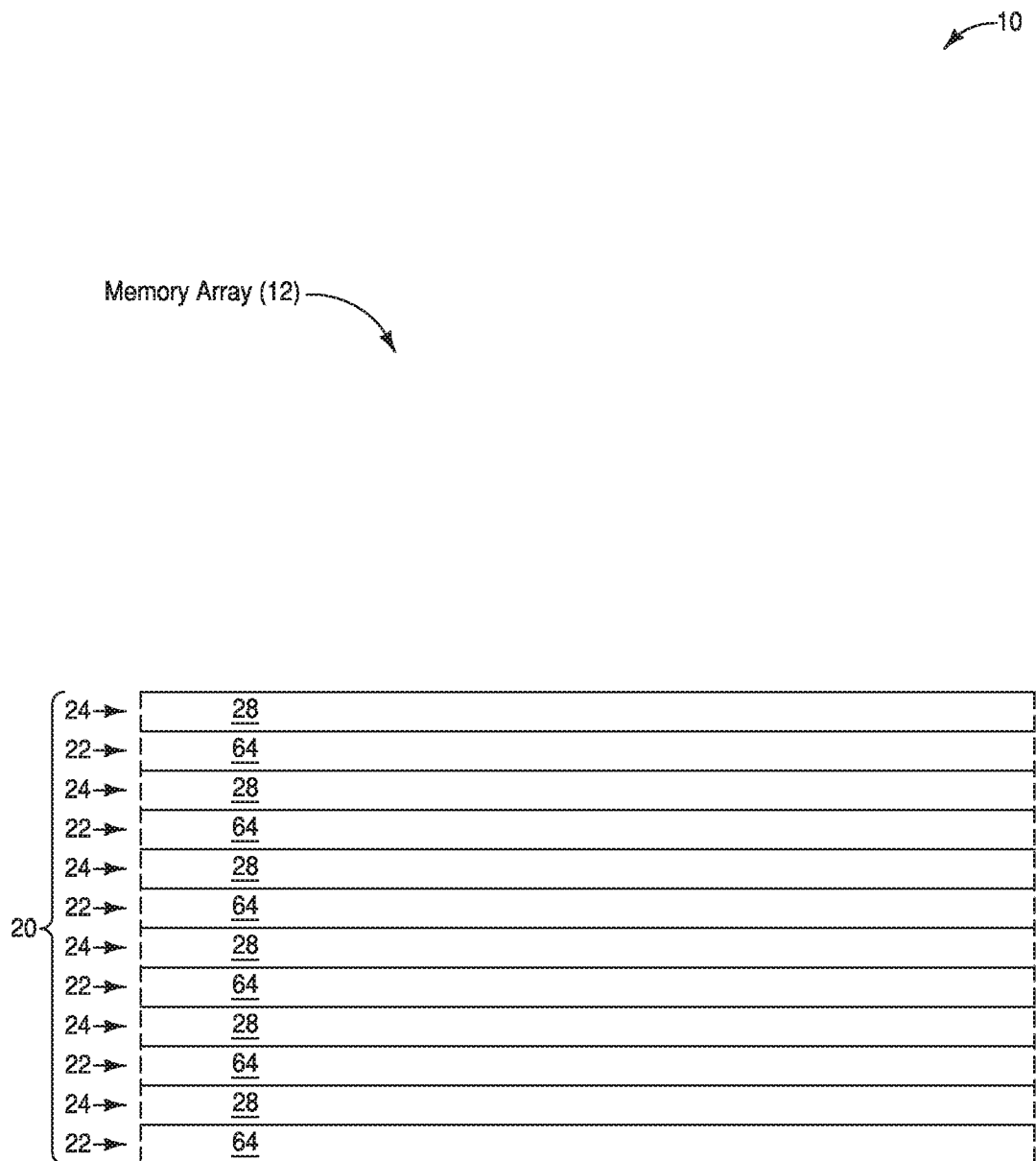
FIG. 7A is a diagrammatic cross-sectional side view of another region of the example structure of FIG. 7 at an example process stage similar to that of FIG. 7.

FIG. 7A shows a memory array region 12 proximate the staircase region 14 of FIG. 7, and at a similar (or identical) process stage as the staircase region 14 of FIG. 7. The stack 20 extends across the memory array region 12.

The portion of the stack 20 within the memory array region 12 may be referred to as a first portion (or first region)

of the stack, and the portion of the stack 20 within the staircase region 14 may be referred to as a second portion (or second region) of the stack.

The source structure 46 (FIG. 6) and the base 58 (FIG. 6) are not shown in FIGS. 7 and 7A to simplify the drawings. However, it is to be understood that such structures may be present under the stack 20 of FIGS. 7 and 7A.

Figure 8:
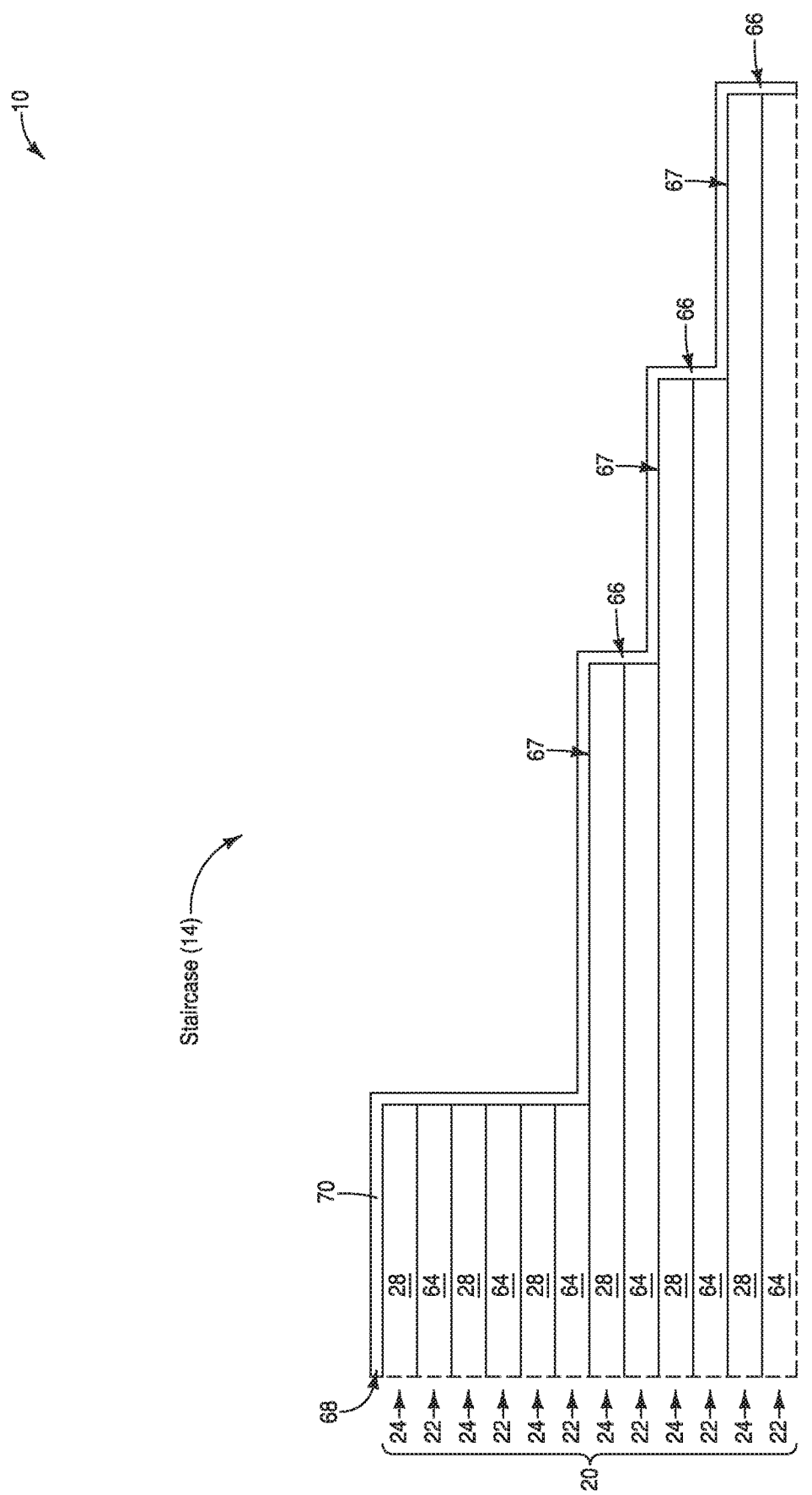

Referring to FIG. 8, a protective liner 68 is formed over the stack 20 within the staircase region 14. The protective liner 68 comprises a liner material 70. Such liner material may comprise any suitable composition(s); and in some embodiments may comprise, consist essentially of, or consist of one or more insulative oxides. For instance, the liner material 70 may comprise, consist essentially of, or consist of one or more of SiO, AlO, HfO, ZrO, and TaO; where the chemical formulas indicate primary constituents rather than specific stoichiometries.

The liner 68 may have any suitable thickness; and in some embodiments may have a thickness within a range of from about 10 nm to about 100 nm, within a range of from about 20 nm to about 50 nm, etc.

Figure 9:
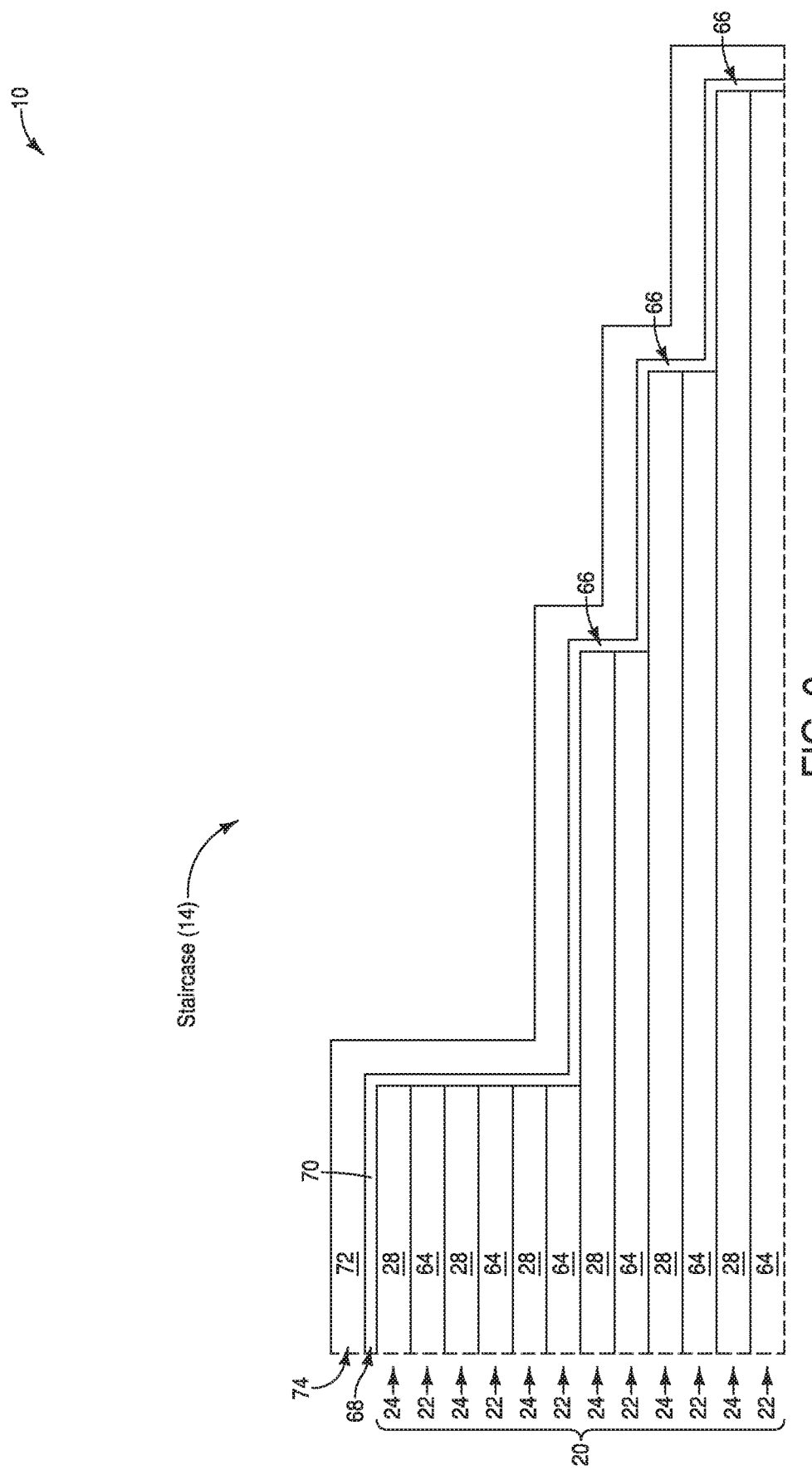

Referring to FIG. 9, etch-stop material 72 is formed over the protective liner 68. The etch-stop material forms an etch-stop layer (structure) 74.

The etch-stop material 72 may comprise any suitable composition(s). The etch-stop material may be insulative or conductive. In some embodiments, the etch-stop material may comprise, consist essentially of, or consist of one or more of aluminum oxide, carbon-doped silicon nitride, silicon and tungsten. If the etch-stop material comprises carbon-doped silicon nitride, the carbon concentration may be within a range of from about 5 atomic percent (at %) to about 20 at %, within a range of from about 10 at % to about 15 at %, etc. If the etch-stop material comprises silicon, the silicon may be effectively undoped (i.e., may comprise less than or equal to about $10^{15}$ atoms/cm$^3$ of conductivity-enhancing dopant therein). The silicon may be in any suitable crystalline form, and in some embodiments may be polycrystalline and/or amorphous.

The etch-stop layer 74 may have any suitable thickness; and in some embodiments may have a thickness within a range of from about 50 nm to about 250 nm, within a range of from about 20 nm to about 100 nm, within a range of from about 40 nm to about 60 nm, etc.

Figure 10:
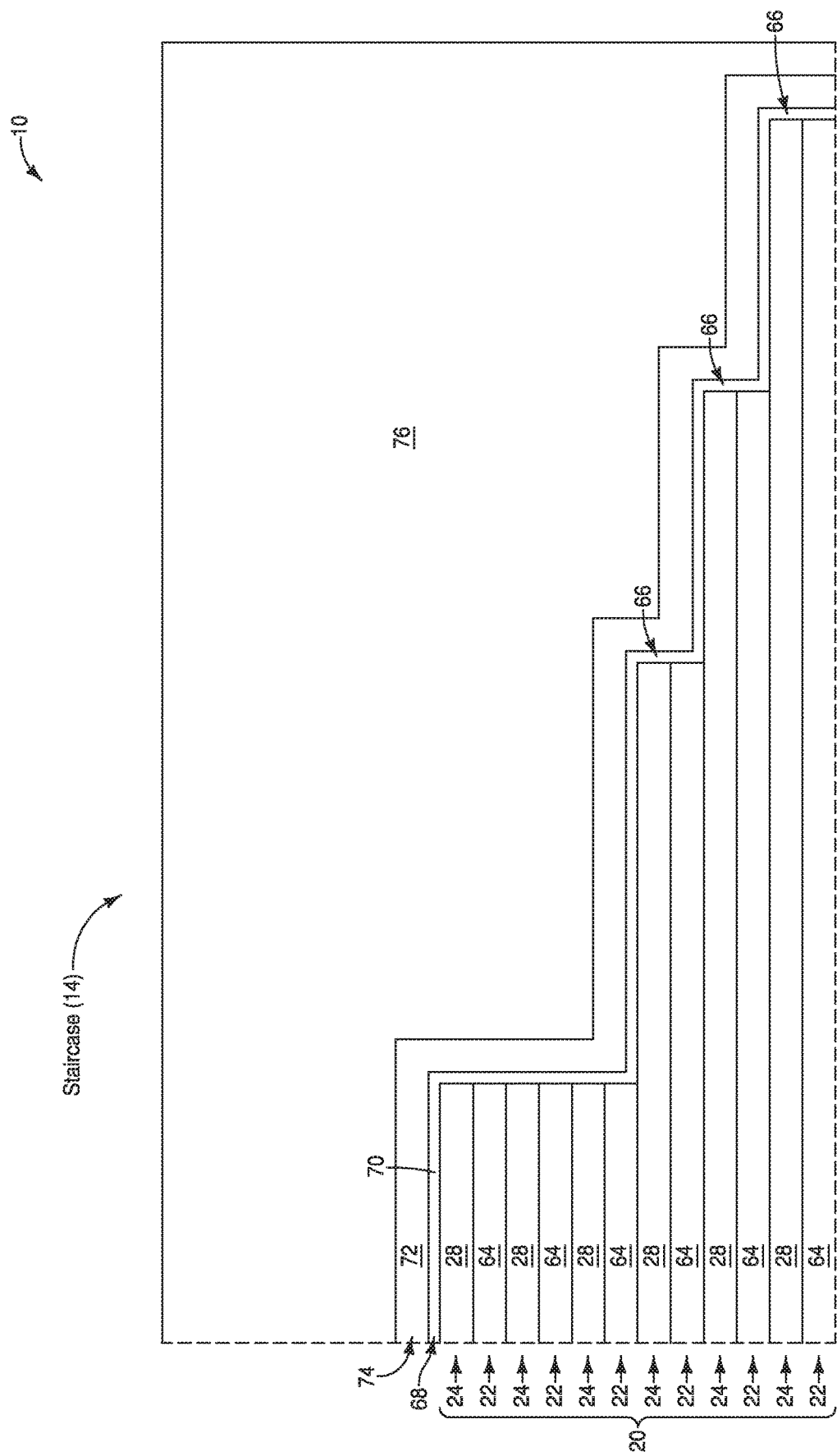

Referring to FIG. 10, a material 76 is formed over the etch-stop material 72. The material 76 may be referred to as a fill material, and in some embodiments may be referred to as a first fill material to distinguish it from another fill material formed at a subsequent process stage. The material 76 is over the steps 66.

The material 76 may comprise any suitable composition(s); and in some embodiments may comprise, consist essentially of, or consist of silicon dioxide and/or doped silicate glass (e.g., borophosphosilicate glass, phosphosilicate glass, fluorosilicate glass, etc.).

Referring to FIG. 11, a planarized surface 77 is formed to extend across the upper level 24 of stack 20, and in the shown embodiment is across the materials 70, 72 and 76. The planarized surface 77 may be formed utilizing any suitable processing, including, for example, chemical-mechanical polishing (CMP).

Referring to FIG. 12, openings 78 are formed to extend through the fill material 76 to the etch-stop material 72. In the illustrated embodiment, the openings 78 penetrate partially into the etch-stop material. In other embodiments, the openings 78 may stop at an upper surface of the etch-stop material. Each of the openings 78 is aligned with one of the steps 66.

Figure 6:
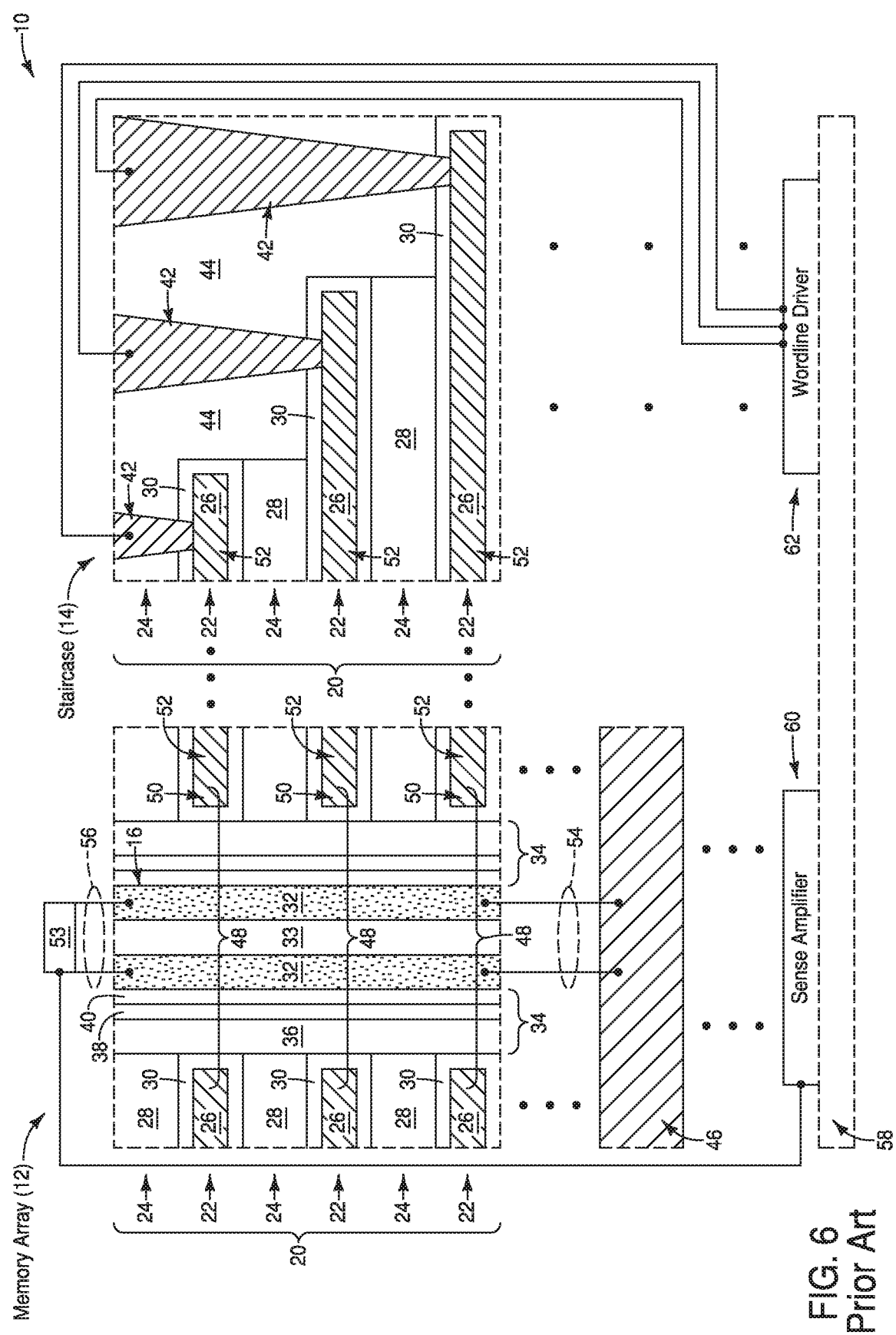
FIG. 6 is a diagrammatic cross-sectional side view of regions of the prior art assembly of FIG. 5.

In some embodiments, the formation of the openings 78 may be conducted simultaneously with formation of openings through the stack 20 in the memory array region 12 utilized to provide locations for the materials 32, 33, 36, 38 and 40 shown in FIG. 6.

The openings 78 may be referred to as first openings to distinguish them from other openings formed at subsequent process stages.

Referring to FIG. 13, sacrificial material 80 is formed within the openings 78. The sacrificial material 80 may comprise any suitable composition(s); and in some embodiments may comprise, consist essentially of, or consist of one or more of aluminum oxide, silicon and tungsten.

The sacrificial material 80 may be referred to as a second sacrificial material to distinguish it from the first sacrificial material 64.

A planarized surface 79 is formed to extend across the upper layer 24 of the stack 20, across the liner material 70, the etch-stop material 72, the fill material 76 and the sacrificial material 80. The planarized surface 79 may be formed with any suitable processing, including, for example, CMP.

Referring to FIG. 14, a second stack 86 is formed over the planarized surface 79, and accordingly is formed over the first stack 20. The second stack comprises alternating third and fourth levels 82 and 84. The levels 82 and 84 may comprise the same thicknesses as the levels 22 and 24. In the illustrated embodiment, the third levels 82 comprise the same sacrificial material 64 as the first levels 22, and the fourth levels 84 comprise the same insulative material 28 as the second levels 24.

The second stack is chopped to leave an opening over the steps 66, and such opening is filled with a second fill material 88. The second fill material 88 may be considered to be laterally adjacent to the second stack 86. The second fill material 88 may comprise any of the compositions described above as being suitable for the first fill material 76. The first and second fill materials 76 and 88 may comprise a same composition as one another (e.g., may both comprise silicon dioxide) or may comprise different compositions relative to one another (e.g., one may comprise silicon dioxide, while the other comprises a doped silicate glass). Also, in some embodiments both of the fill materials 76 and 88 may comprise a same composition as the material 70 of the protective liner 68.

Figure 14A:
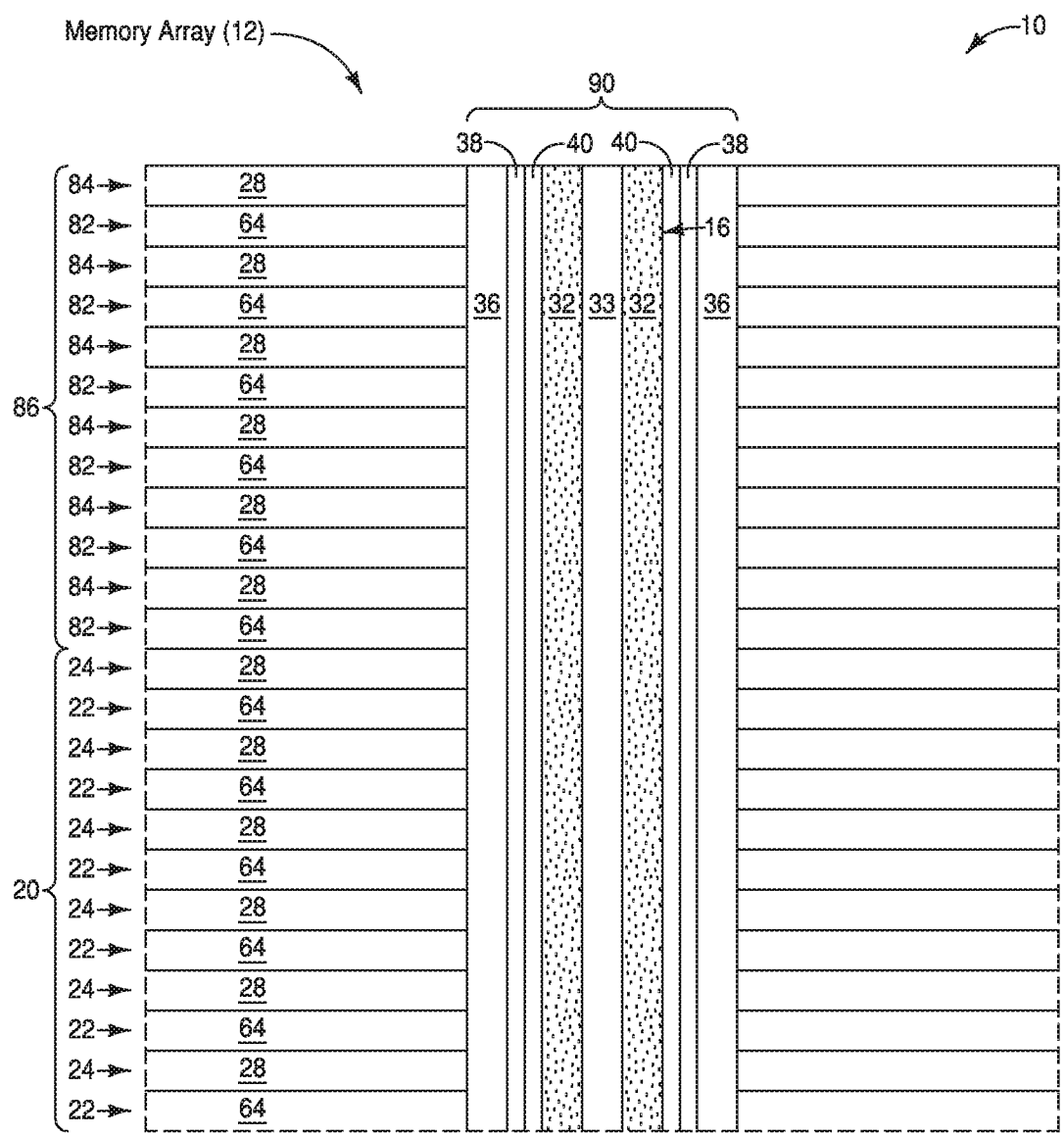
FIG. 14A is a diagrammatic cross-sectional side view of the region of FIG. 7A at an example process stage similar to that of FIG. 14.

FIG. 14A shows the memory array region 12 at a similar process stage to that of FIG. 14 (which may be an identical process stage to that of FIG. 14), and shows the second stack 86 formed over the first stack 20. Also, an opening 90 has been formed through the first and second stacks, and then the materials 32, 33, 36, 38 and 40 have been formed within such opening.

The channel material 32 comprises semiconductor material; and may comprise any suitable composition or combination of compositions. For instance, the channel material 32 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 32 may comprise, consist essentially of, or consist of silicon.

The tunneling material (gate dielectric material) 40 may comprise any suitable composition(s). In some embodiments, the tunneling material 40 may comprise, for example, one or more of silicon dioxide, aluminum oxide, hafnium oxide, zirconium oxide, etc.

The charge-blocking material 36 may comprise any suitable composition(s); and in some embodiments may comprise, consist essentially of, or consist of silicon dioxide and/or one or more high-k materials (e.g., aluminum oxide, zirconium oxide, hafnium oxide, etc.); with the term "high-k" meaning a dielectric constant greater than that of silicon dioxide.

The material 38 may be referred to as a charge-storage material, and may comprise any suitable composition(s). In some embodiments, the charge-storage material 38 may comprise charge-trapping material, such as silicon nitride, silicon oxynitride, conductive nanodots, etc. For instance, in some embodiments the charge-storage material 38 may comprise, consist essentially of, or consist of silicon nitride.

The insulative material 33 may comprise any suitable composition(s); and in some embodiments may comprise, consist essentially of, or consist of silicon dioxide.

Figure 1:
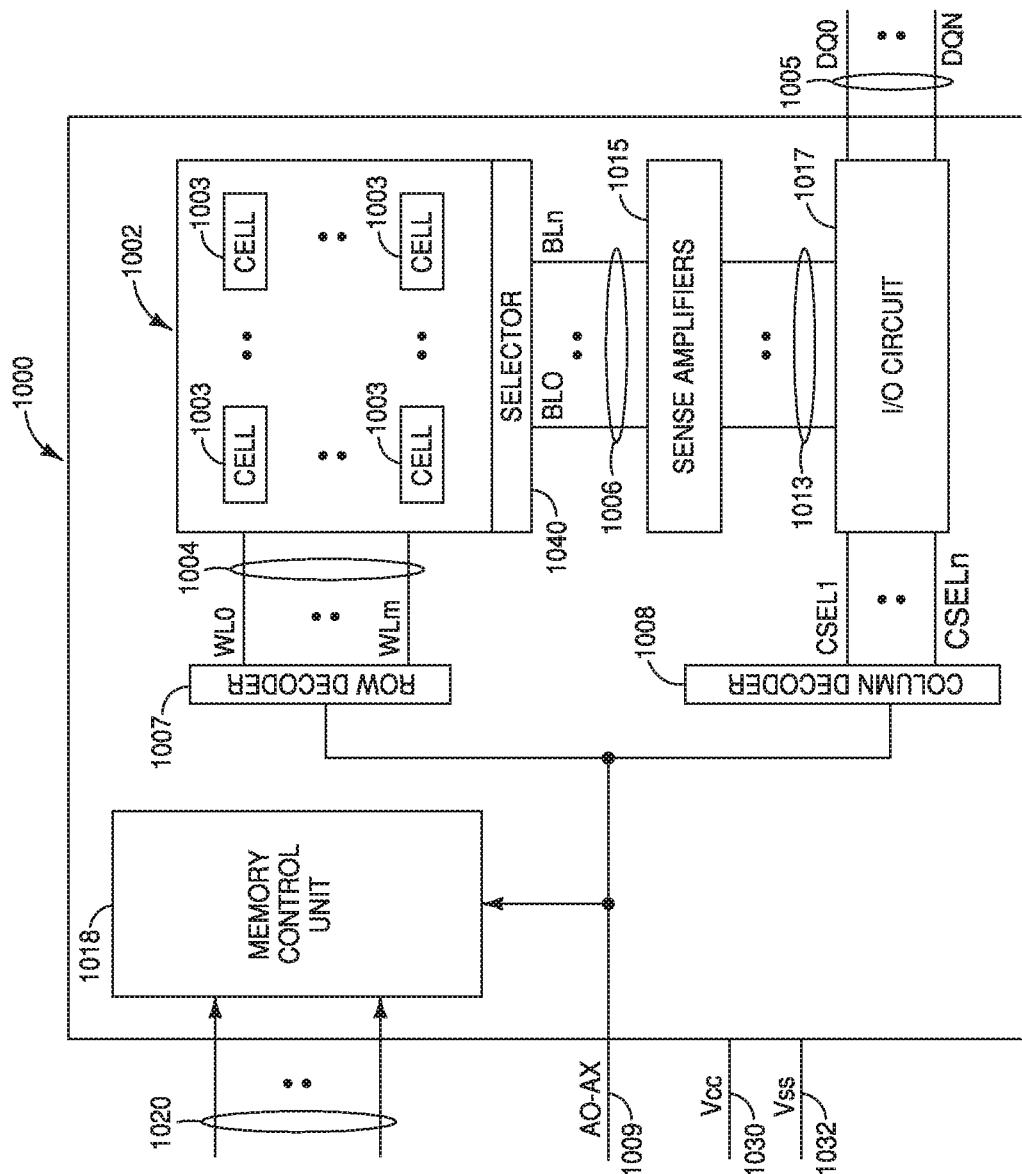
FIG. 1 shows a block diagram of a prior art memory device having a memory array with memory cells.
Figure 2:
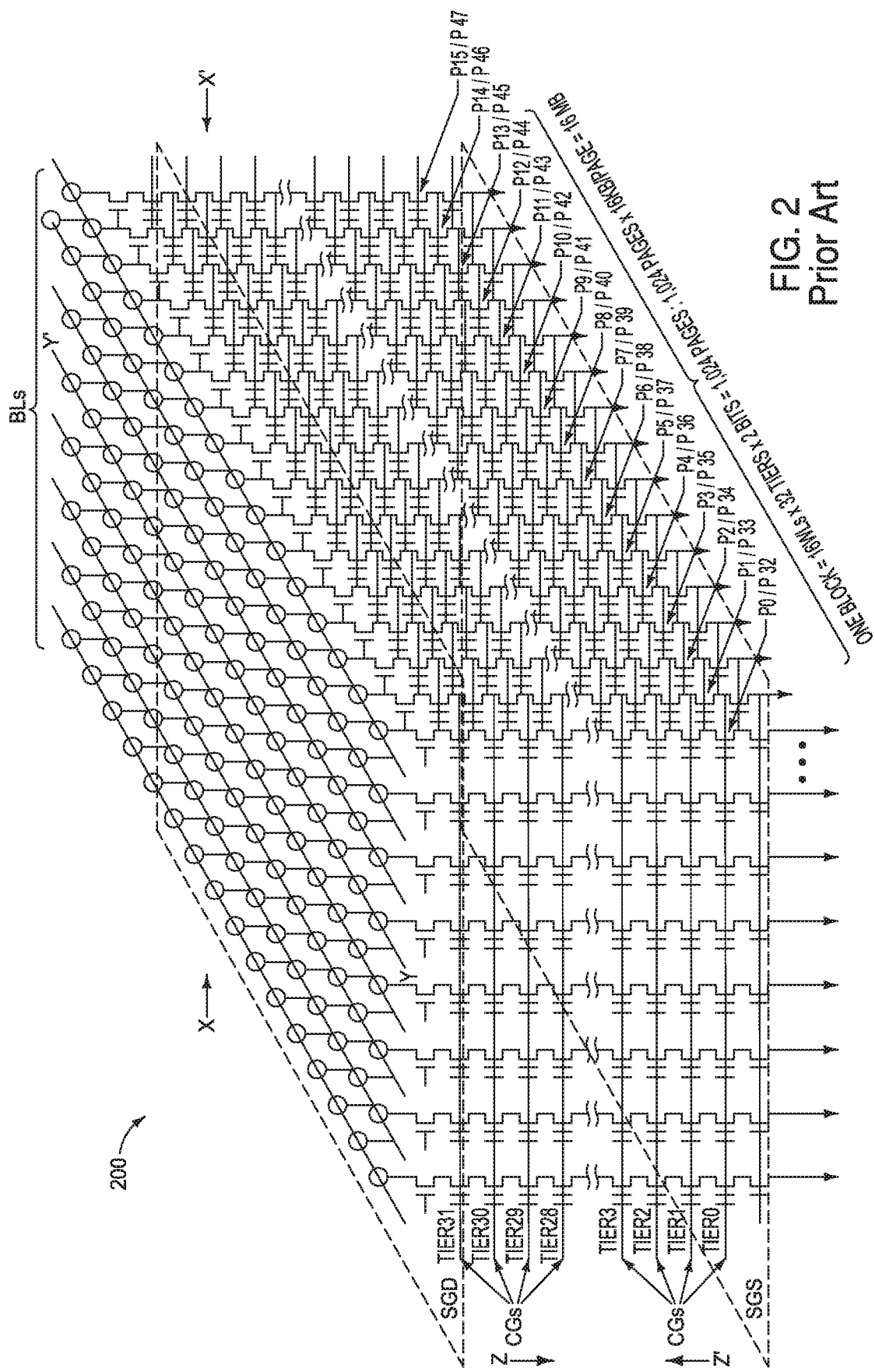
FIG. 2 shows a schematic diagram of the prior art memory array of FIG. 1 in the form of a 3D NAND memory device.
Figure 3:
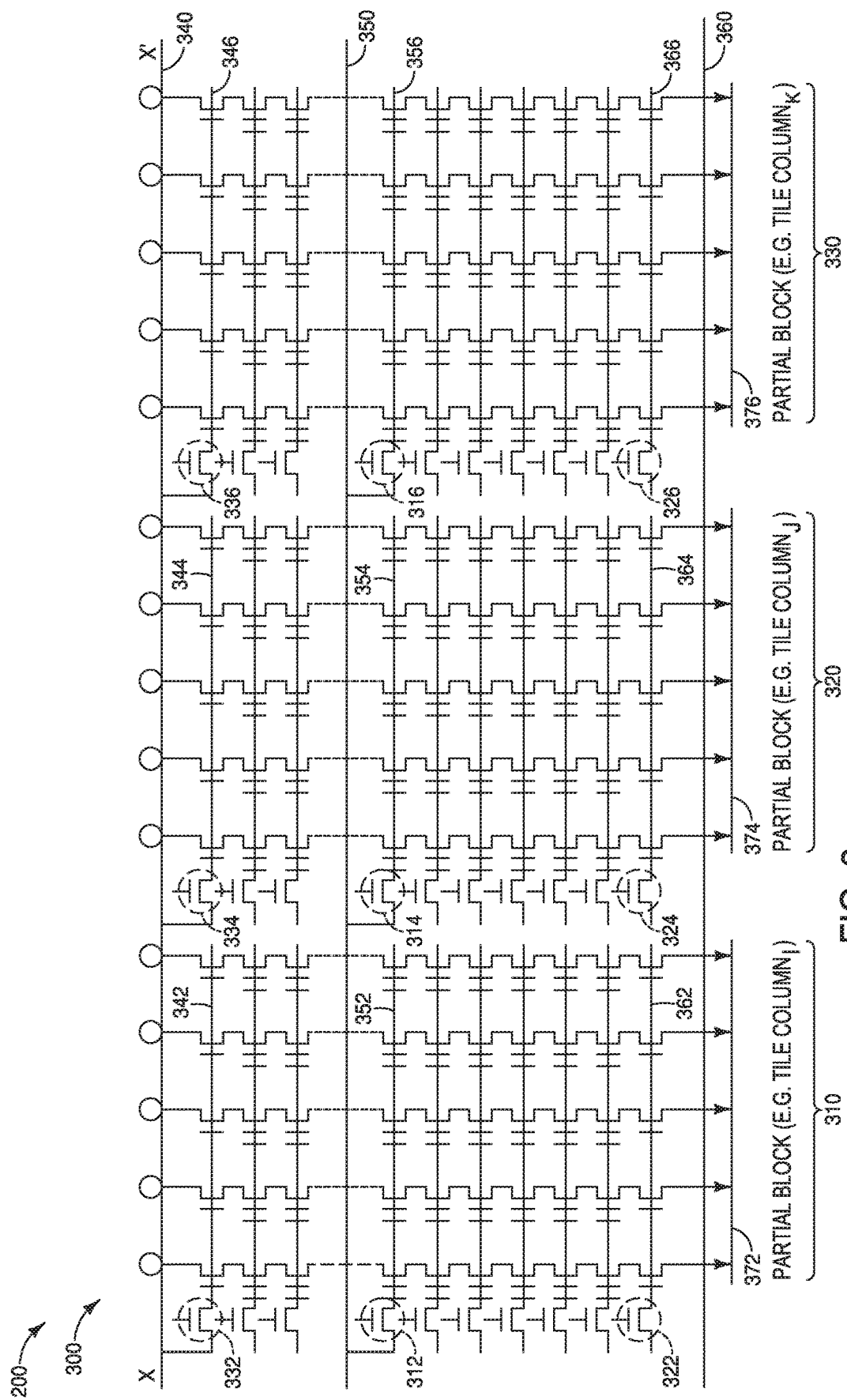
FIG. 3 shows a cross-sectional view of the prior art 3D NAND memory device of FIG. 2 in an X-X' direction.
Figure 4:
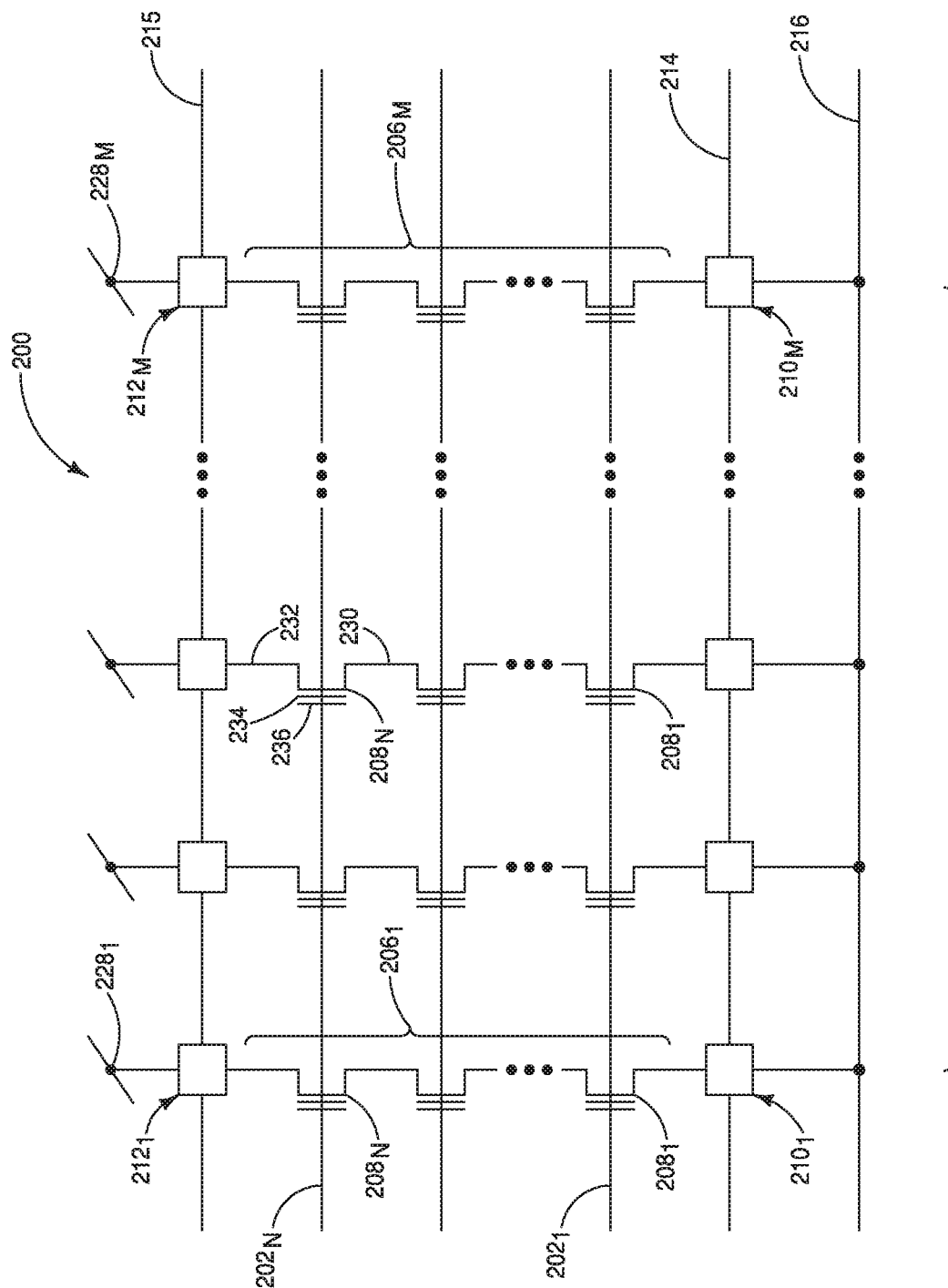
FIG. 4 is a schematic diagram of a prior art NAND memory array.
Figure 5:
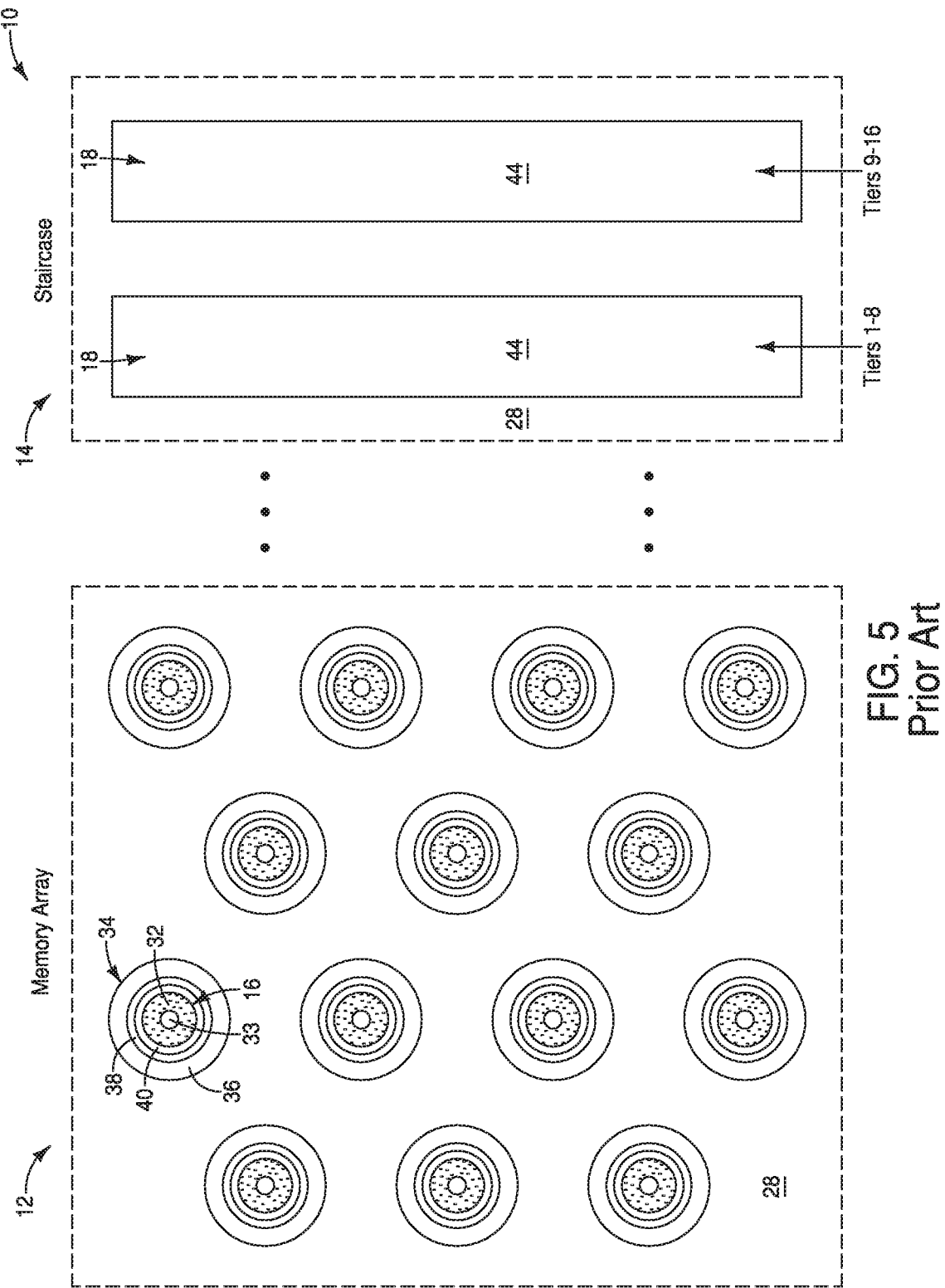
FIG. 5 is a diagrammatic top-down view of regions of a prior art integrated assembly.

The channel material 82 is configured as a channel-material-pillar 16 of the type described above with reference to FIGS. 5 and 6. The illustrated channel-material-pillar 16 of FIG. 14A may be representative of a large number of channel-material-pillars formed across the memory array region 12.

In some embodiments, the second stack 86 may be considered to have a first portion (region) within the staircase region 14, and a second portion (region) within the memory array region 12. In some embodiments, the regions of the second stack 86 within the memory array region 12 and the staircase region 14 may be referred to as third and fourth regions, respectively; to distinguish them from the first and second regions of the first stack 20 which were described above as being within the memory array region 12 and the staircase region 14, respectively.

The second stack 86 is not over the steps 66. The steps 66 may be considered to be accessed within a first interconnect region (analogous to the interconnect regions 18 of FIG. 5). The second stack 86 (and regions of the first stack 20 over the steps 66) may be accessed in other interconnect regions (analogous to the interconnect regions 18 of FIG. 5).

In some embodiments, the first stack 20 may be considered to be a first deck comprising the alternating levels 22 and 24, and the second stack 86 may be considered to be a second deck comprising the alternating levels 82 and 84. There may be an advantage to forming the opening 90 in two steps, with a first step being through the first deck 20, and a second step being through the second deck 86, particularly if there are a large number of the alternating materials 28 and 64.

Figure 15:
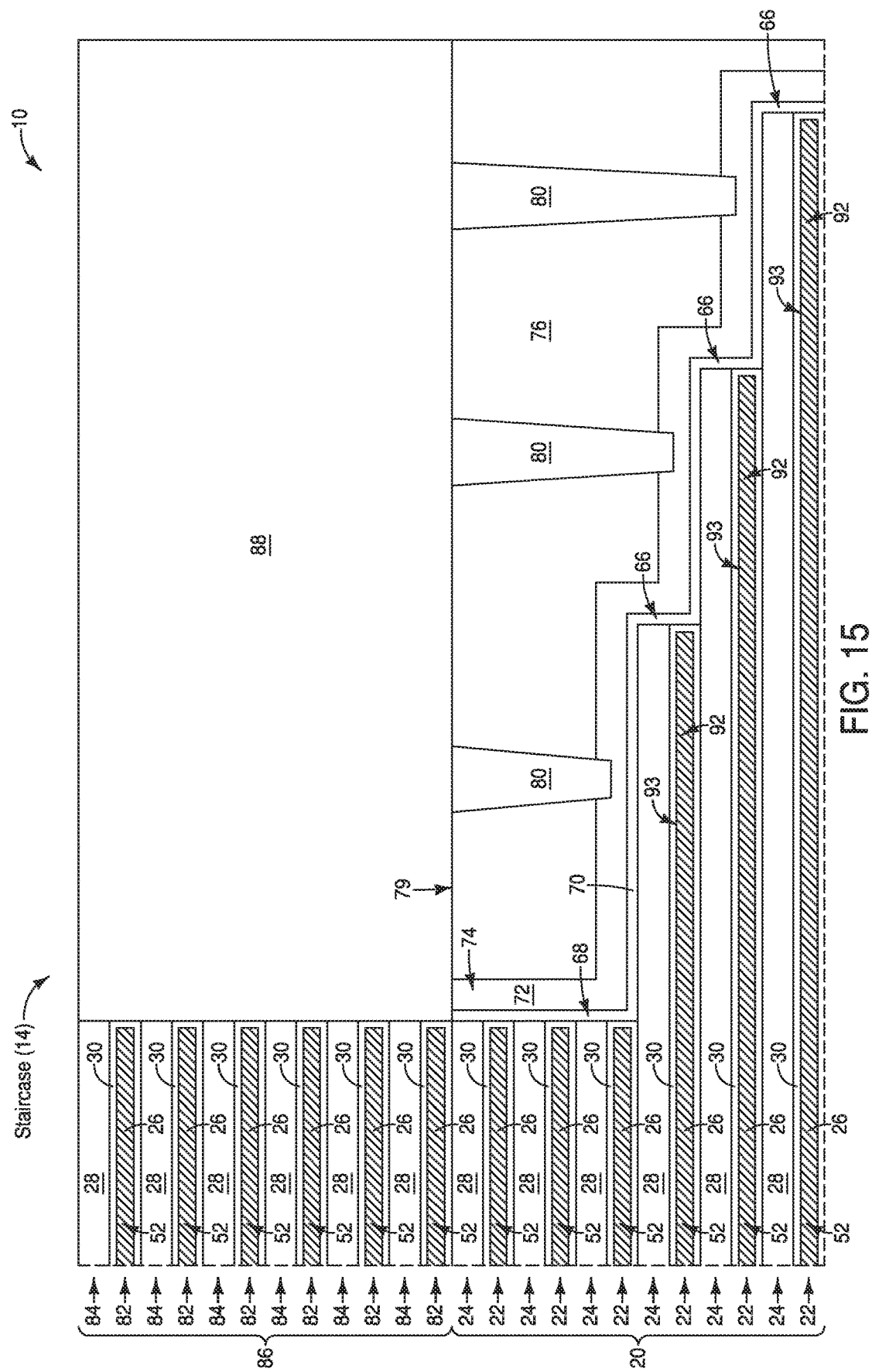
FIG. 15 is diagrammatic cross-sectional side view of the region of the example structure of FIG. 7 at an example process stage following that of FIG. 14.
Figure 15A:
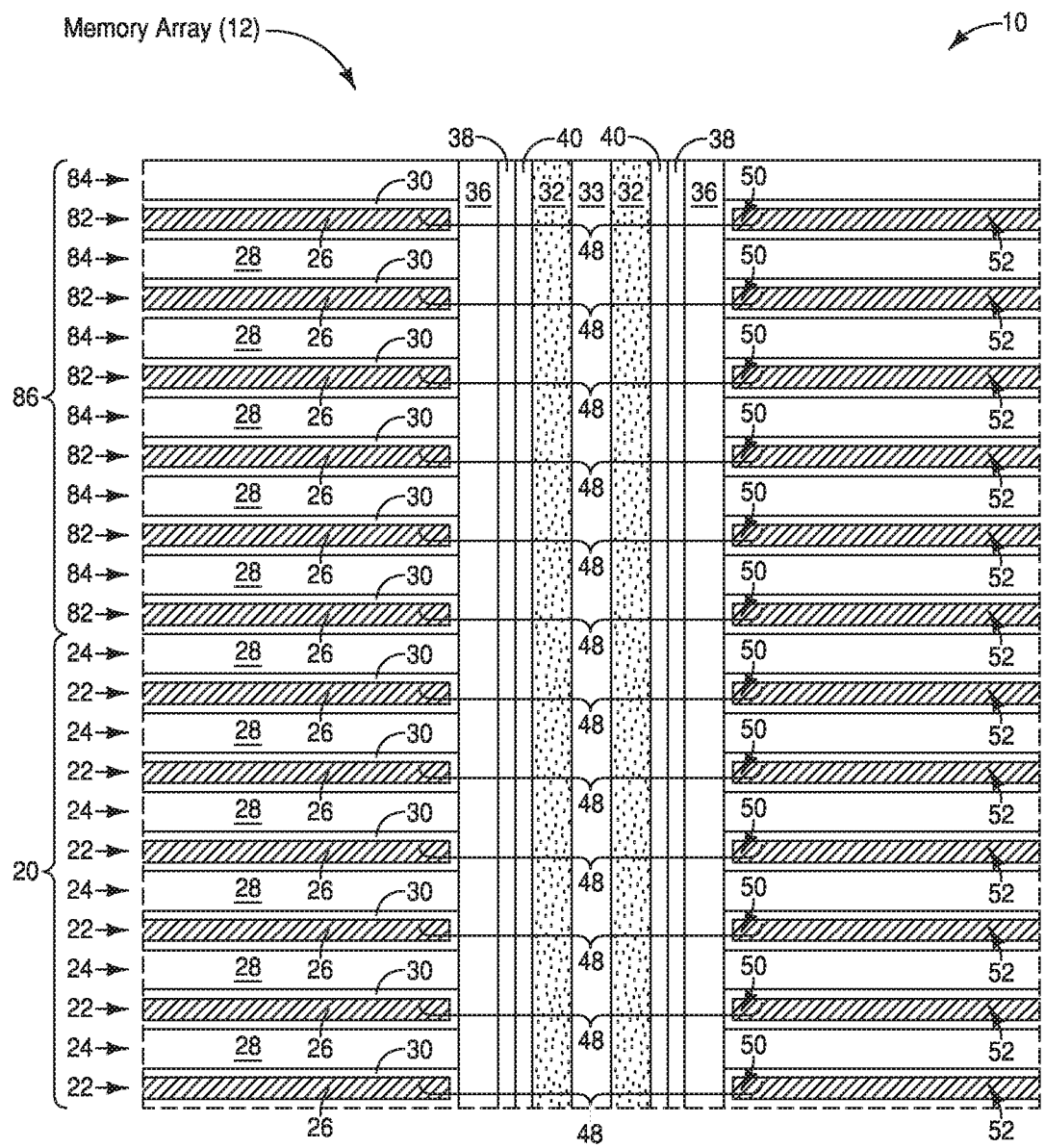
FIG. 15A is a diagrammatic cross-sectional side view of the region of FIG. 7A at an example process stage similar to that of FIG. 15.

Referring to FIGS. 15 and 15A, the sacrificial material 64 (FIGS. 14 and 14A) is removed, and the conductive material 26 is formed within the levels 22 and 82. Also, in the shown embodiment the dielectric barrier material 30 is formed along outer peripheral surfaces of the conductive material 26.

The sacrificial material 64 (FIGS. 14 and 14A) may be removed with an etch utilizing hot phosphoric acid. The protective liner 68 may protect the etch-stop material 72 from being exposed to such etch. If the etch-stop material 72 is resistant to the etch utilized to remove the sacrificial material 64, the protective liner 68 may be omitted.

The conductive material 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 26 may comprise a tungsten core surrounded by a liner comprising titanium nitride.

The dielectric-barrier material 30 may comprise any suitable composition(s). In some embodiments, the dielectric-barrier material 30 may comprise high-k material (for instance, one or more of aluminum oxide, hafnium oxide, zirconium oxide, tantalum oxide, etc.). In some embodiments, the dielectric-barrier material 30 may comprise, consist essentially of, or consist of aluminum oxide.

The conductive material 26 within the steps 66 may be considered to be configured as conductive layers 92, with each of such conductive layers having an upper surface 93.

The configuration shown in the memory array region 12 of FIG. 15A may comprise memory cells 48 analogous to those described above with reference to FIG. 6. The conductive levels 22 and 82 may comprise gate regions 50 and routing regions 52 analogous to those described above with reference to FIG. 6. In some embodiments, the conductive layers 93 may be referred to as gate/routing layers of a memory array, with such layers extending into both the memory array region 12 and the staircase region 14.

Figure 16:
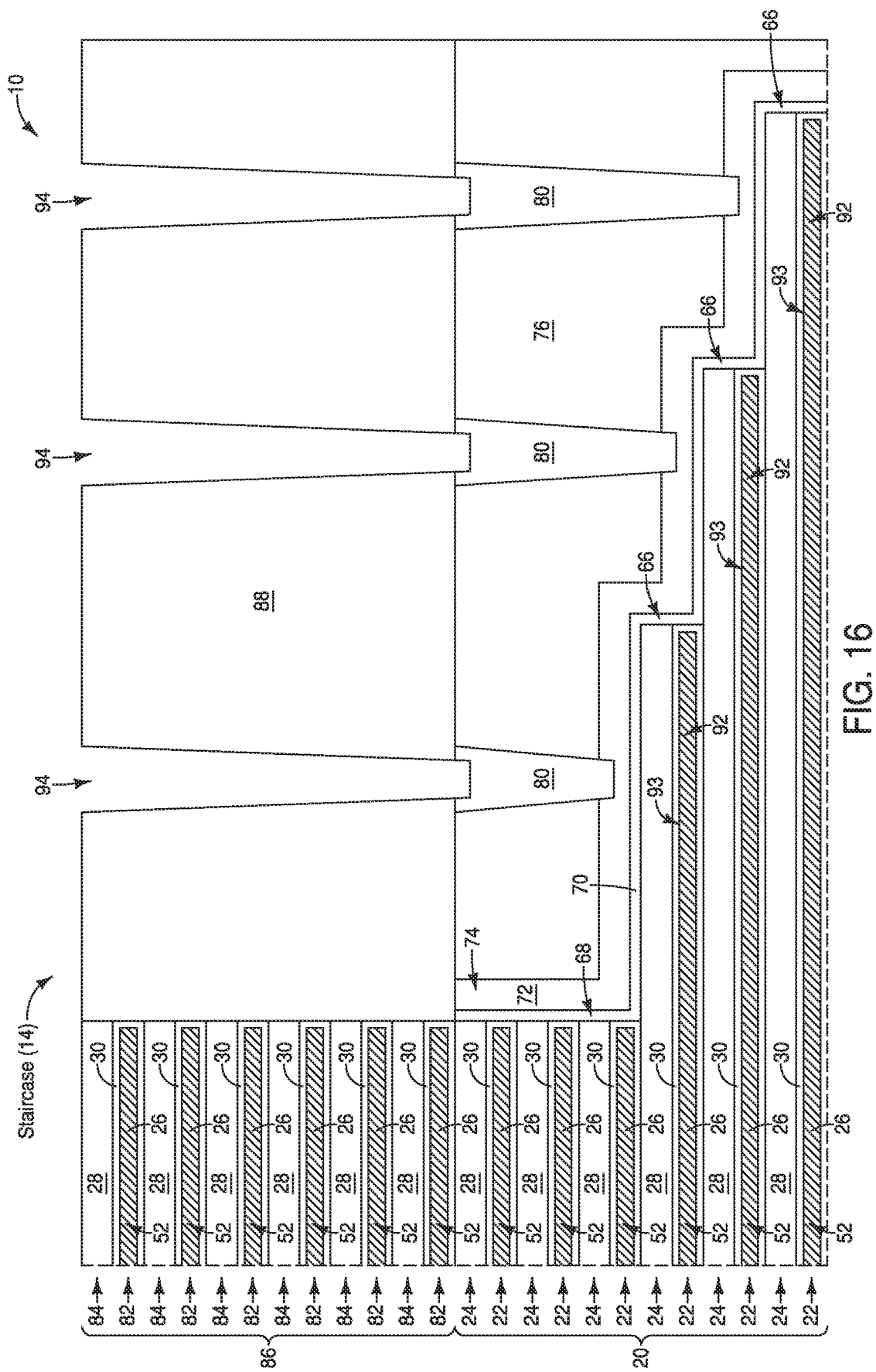
FIGS. 16-20 are diagrammatic cross-sectional side views of the region of the example structure of FIG. 7 at example sequential process stages of an example method. The process stage of FIG. 16 may follow that of FIG. 15.

Referring to FIG. 16, openings 94 are formed to extend through the fill material 88 to the sacrificial material 80. The openings 94 may be referred to as second openings to distinguish them from the first openings 78 described above with reference to FIG. 12. The openings 94 are substantially fixed aspect ratio openings, regardless of how deep the underlying step is (i.e., all of the openings 94 have about the same aspect ratio due to such openings being formed to extend about the same distance through the material 88).

In the illustrated embodiment, the second openings 94 extend partially into the sacrificial material 80. In other embodiments, the second openings 94 may extend to an upper surface of the sacrificial material 80 at the process stage of FIG. 16.

Figure 17:
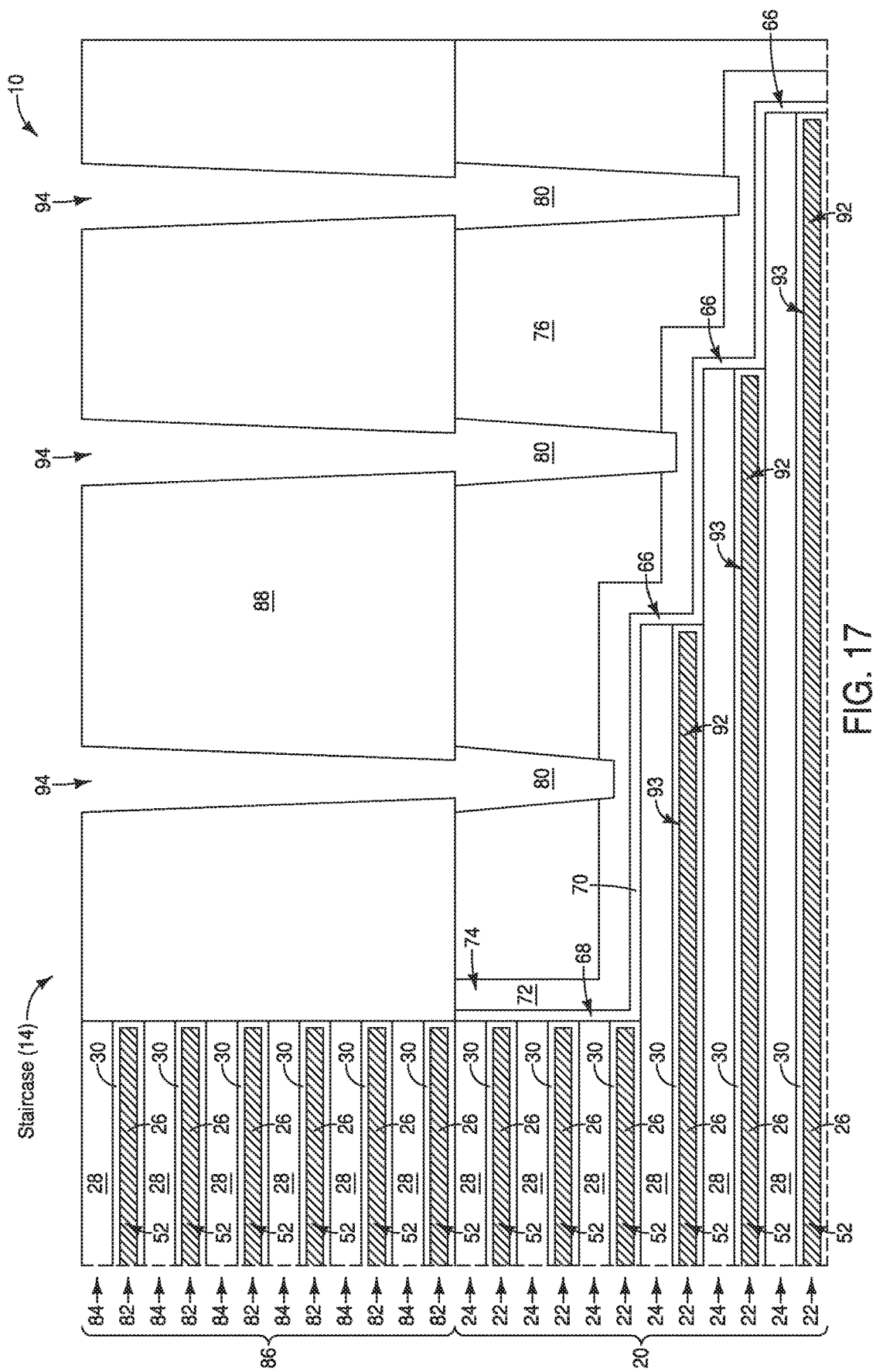

Referring to FIG. 17, the sacrificial material 80 (FIG. 16) is removed to extend the openings 94 through the sacrificial material 80 and to the etch-stop material 72. The openings may stop at an upper surface of the etch-stop material, or may extend into the etch-stop material (as shown).

Figure 18:
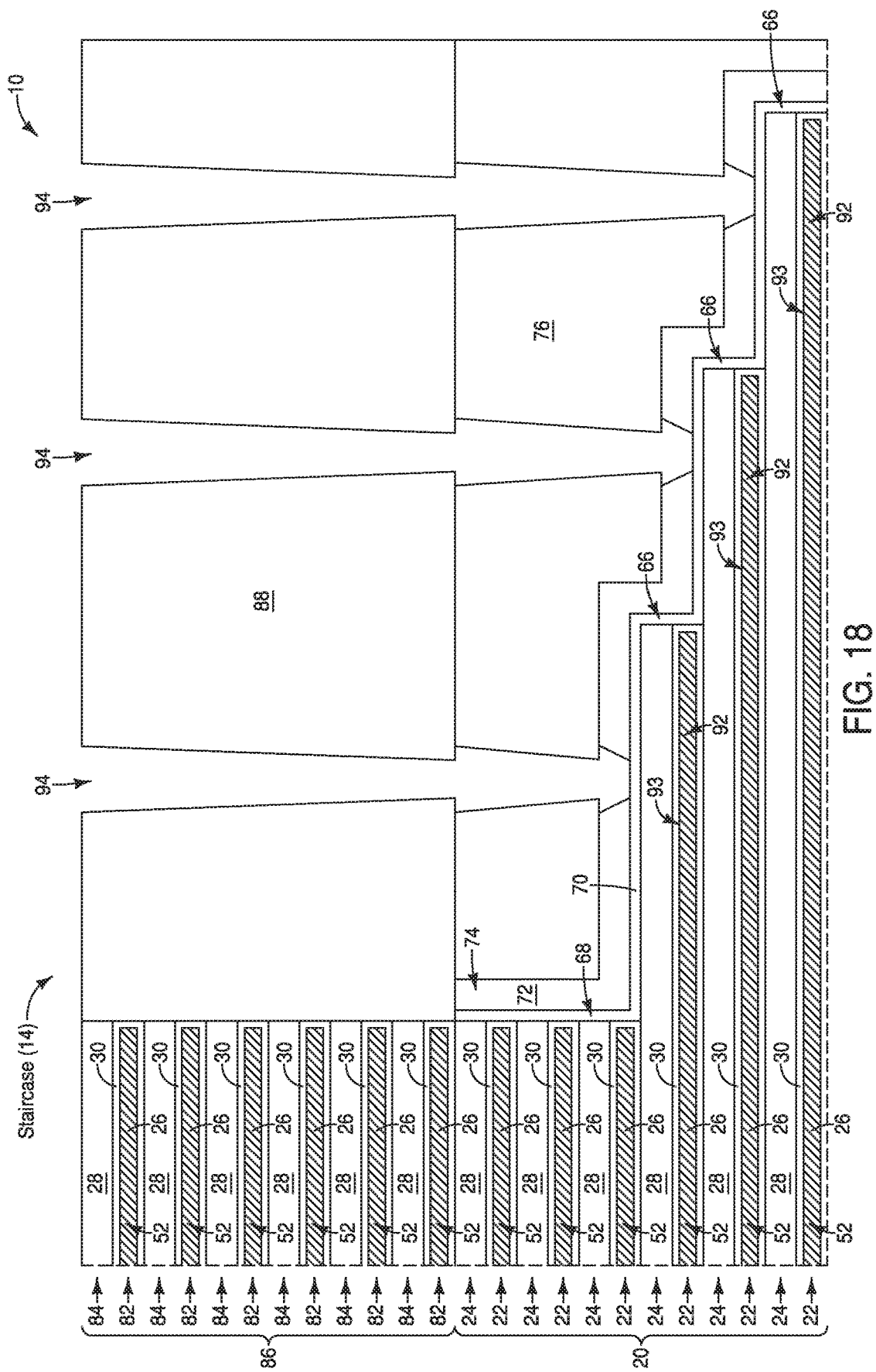

Referring to FIG. 18, the openings 94 are extended through the etch-stop material 72 to the protective material 70. The openings may stop at an upper surface of the protective material (as shown), or may extend into the protective material.

Figure 19:
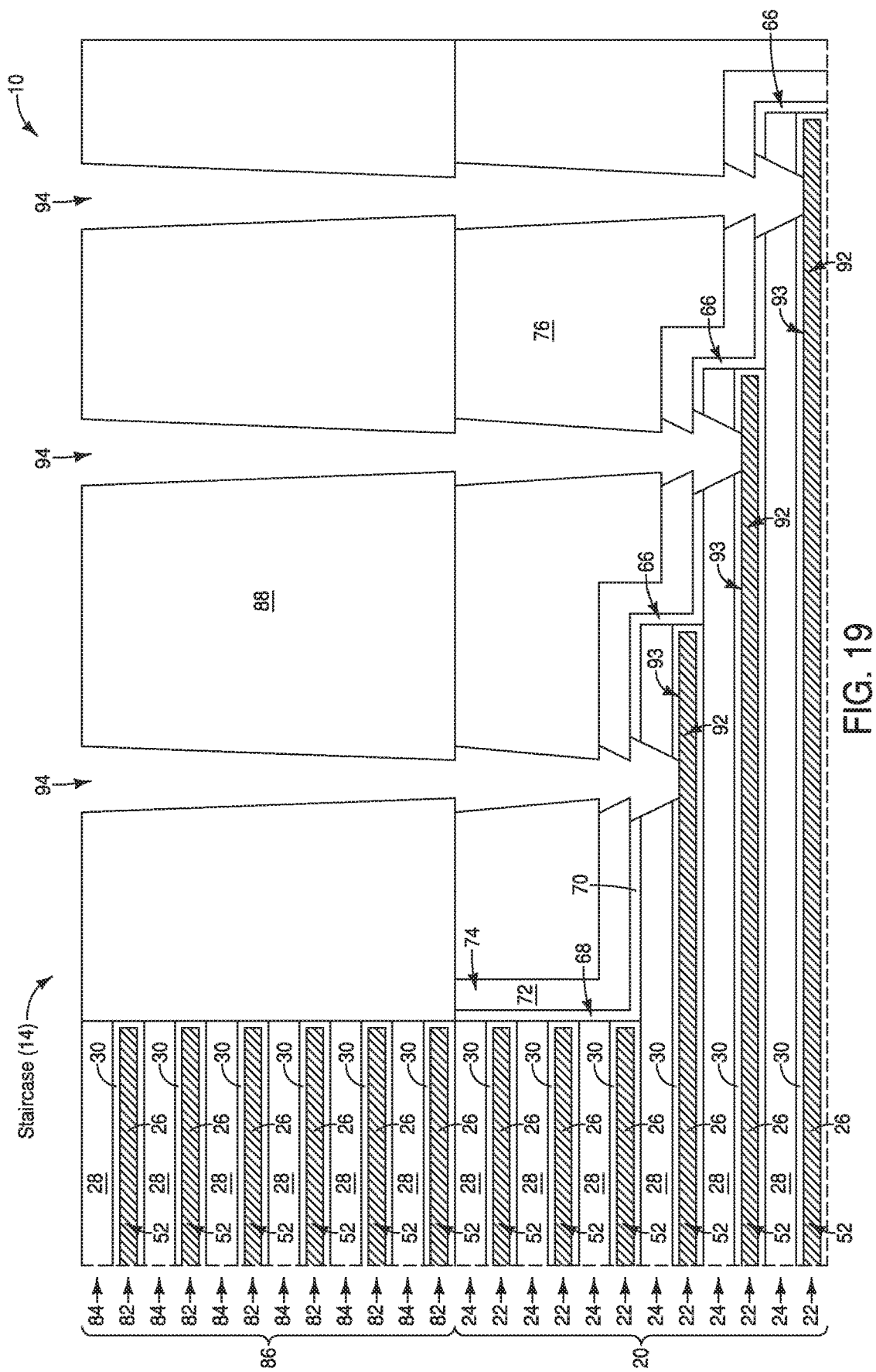

Referring to FIG. 19, the openings 94 are extended through the protective material 70, the insulative material 28 and the dielectric barrier material 30 to the upper surfaces 93 of the conductive layers 92 within the steps 66. The openings may stop at the upper surfaces 93 (as shown), or may extend into the conductive layers 92.

Although the formation of the openings 94 and extension of such openings downwardly to the upper surfaces 93 of the steps 92 is shown occurring through multiple sequence stages (FIGS. 16-19), it is to be understood that such openings may be formed and extended with only a single etch, or with multiple etches, depending on the etch chemistry(ies) and the compositions of the various materials 28, 30, 70, 72, 80 and 88.

Although the replacement of the sacrificial material 64 (FIG. 14) is shown occurring at the process stage of FIG. 15, it is to be understood that in other embodiments such replacement may occur at any process stage prior to that of FIG. 19. It is desired that the conductive layers 92 be present at the process stage of FIG. 19 so that the openings 94 may stop on (or, in some embodiments, may extend into) such conductive material.

Figure 20:
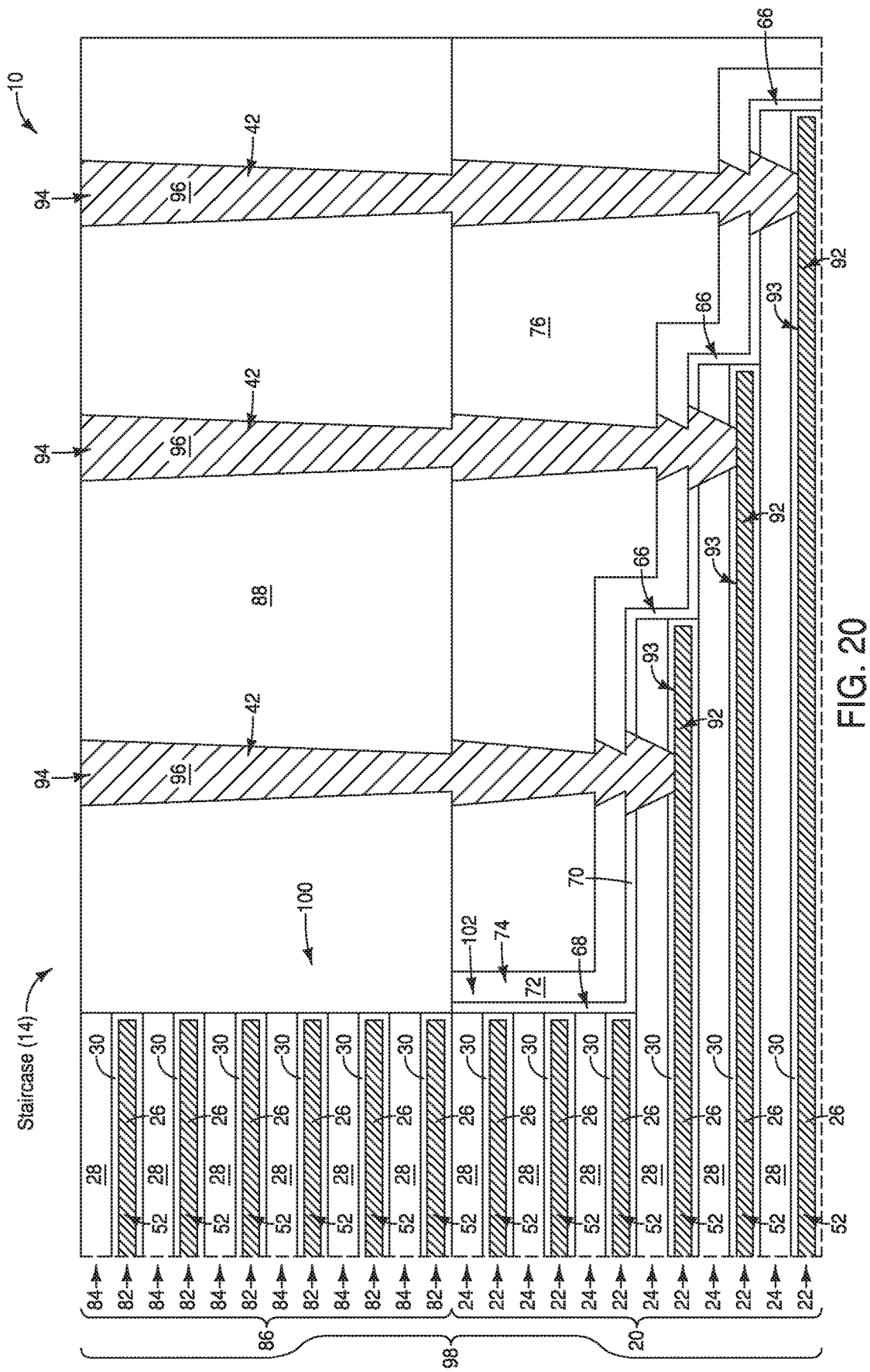

Referring to FIG. 20, conductive material 96 is formed within the openings 94 to form interconnects 42 analogous to those described above with reference to FIG. 6.

The conductive material 96 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 96 may be a metal-containing material, and may comprise one or more of tungsten, titanium nitride, tungsten nitride, etc.

The conductive interconnects 42 of FIG. 20 may be coupled with driver circuitry 62 analogous to that shown in FIG. 6.

In some embodiments, the stacks 20 and 86 may be together considered to be a common stack 98 comprising alternating insulative levels (24, 84) and conductive levels (22, 82). In some embodiments, the insulative levels (24, 84) may be referred to as first levels, and the conductive levels (22, 82) may be referred to as second levels, or vice versa.

The stack 98 may be considered to have an upper portion 100 and a lower portion 102, with at least some of the first and second levels being configured as steps 66 within the lower portion. Each of the steps has one of the levels 24 over an associated one of the levels 22.

The layer 74 is over the steps and along the lower portion 102 of the stack 98. The layer 74 is spaced from the stack 98 by an intervening insulative region corresponding to the liner material 70.

The substances 76 and 88 may be considered together as an insulative material over the layer 74. The conductive interconnects 40 to extend through such insulative material, extend through the layer 74, and through the intervening insulative region (i.e., the protective material 70) to be electrically coupled with the conductive material 26 within the first levels 22 of the steps 66. In some embodiments, the substances 76 and 88 may comprise a same composition as one another, and in other embodiments they may comprise different compositions relative to one another. Also, in some embodiments the protective material 70 may comprise a same composition as one or both of the substances 76 and 88.

As discussed above, in some embodiments the etch-stop material 72 may be electrically conductive (e.g., may comprise tungsten). In such embodiments, it may be advantageous to electrically isolate the etch-stop material 72 from the interconnects 42. FIG. 21 shows an example process stage analogous to that of FIG. 20, but in which insulative spacers 100 are formed adjacent the interconnects 42 to isolate the interconnects from the etch-stop material 72. The spacers 100 may comprise any suitable insulative composition(s); and in some embodiments may comprise, consist essentially of, or consist of one or more of silicon dioxide, silicon nitride, aluminum oxide, etc.

The spacers 100 may be formed with any suitable processing. For instance, the spacers 100 may be formed with a wet etch of the etch-stop material 72 at the process stage of FIG. 17 or FIG. 18, followed by deposition of the insulative material of spacers 100 within cavities formed by the wet etch.

The processing described herein may advantageously improve formation of conductive interconnects (42) to the deep steps within a staircase region. Specifically, the forming of the openings 94 at multiple stages may avoid high critical dimensions (aspect ratios) associated with conventional processing. The processing described herein may advantageously provide scaling capability and location flexibility for staircase contact structures (interconnects), provide a controlled landing for contacts on the wordlines 52 (with such landing being better controlled than conventional processes since the landing is accomplished through the relatively short distance established by the sacrificial material 80 of FIG. 14), may provide improved margin for the fill over the staircase region (and may reduce the aspect ratio of the deepest staircases). Also, one or more of the etches utilized to form openings (e.g., the etches utilized to form openings 78 of FIG. 12) may be combined with etches in the memory array region utilized to form openings for channel-material-pillars. The sacrificial material 80 may be formed in openings in the memory array region, as well as within openings in the stadium (staircase) region, and may then be removed during formation of the openings in the memory array region for the channel-material-pillars, and during the formation of the openings in the staircase region for formation of the interconnects 42.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A first stack of alternating first and second levels is formed. The first levels comprise a first sacrificial material and the second levels comprise an insulative material. At least some of the first and second levels are configured as steps. Each of the steps has one of the second levels over an associated one of the first levels, and has an upper surface corresponding to an upper surface of said one of the second levels. An etch-stop material is formed over the stack. A first fill material is formed over the etch-stop material. First openings are formed to extend through the first fill material to the etch-stop material. A second sacrificial material is formed within the first openings. A second stack is formed over the first stack. The second stack has alternating third and fourth levels. The third levels comprise the first sacrificial material and the fourth levels comprising the insulative material. The second stack is not over the steps. A second fill material is formed over the first fill material and adjacent to the second stack. The first sacrificial material is removed, and conductive layers are formed within the first and third levels. The conductive layers within the steps have upper surfaces. Second openings are formed to extend through the second fill material to the second sacrificial material. The second openings are extended through the sacrificial material, the etch-stop material and the protective liner to the upper surfaces of the conductive layers within the steps. Conductive interconnects are formed within the extended second openings.

Some embodiments include a method of forming an integrated assembly. A first stack of alternating first and second levels is formed. The first stack has a first region within a memory array region, and has a second region within a staircase region proximate the memory array region. The first levels comprise a first sacrificial material and the second levels comprise an insulative material, At least some of the first and second levels are configured as steps within the staircase region. Each of the steps comprises one of the second levels over an associated one of the first levels, and has an upper surface corresponding to an upper surface of said one of the second levels. A protective liner is formed over the second region of the first stack. An etch-stop material is formed over the second region of the first stack and over the protective liner. A first fill material is formed over the steps, and is over the etch-stop material. First openings are formed to extend through the first fill material to the etch-stop material. A second sacrificial material is formed within the first openings. A second stack is formed over the first stack. The second stack has alternating third and fourth levels. The third levels comprise the first sacrificial material and the fourth levels comprise the insulative material. The second stack has a third region within the memory array region, and has a fourth region within the staircase region. The second stack is not over the steps. A second fill material is formed over the first fill material and adjacent to the second stack within the staircase region. The first sacrificial material is removed, and conductive material is formed within the first and third levels. The conductive material within the steps is configured as conductive layers having upper surfaces. Second openings are formed to extend through the second fill material to the second sacrificial material. The second openings are extended through the sacrificial material, the etch-stop material and the protective liner to the upper surfaces of the conductive layers within the steps. Conductive interconnects are formed within the extended second openings.

Some embodiments include an integrated assembly having a stack of alternating first and second levels. The first levels comprise conductive material and the second levels comprise insulative material. The stack has an upper portion and a lower portion. At least some of the first and second levels within the lower portion are configured as steps. Each of the steps comprises one of the second levels over an associated one of the first levels. A layer is over the steps and along the lower portion of the stack. The layer is not along the upper portion of the stack. The layer is spaced from the stack by an intervening insulative region. Insulative material is over the layer. Conductive interconnects extend through the insulative material, through the layer, through the intervening insulative region and to the conductive material within the first levels of the steps.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a first stack of alternating first and second levels; the first levels comprising a first sacrificial material and the second levels comprising an insulative material; at least some of the first and second levels being configured as steps; each of the steps comprising one of the second levels over an associated one of the first levels, and having an upper surface corresponding to an upper surface of said one of the second levels;
    forming an etch-stop material over the stack;
    forming a first fill material over the etch-stop material;
    forming first openings to extend through the first fill material to the etch-stop material;
    forming a second sacrificial material within the first openings;
    forming a second stack over the first stack; the second stack having alternating third and fourth levels; the third levels comprising the first sacrificial material and the fourth levels comprising the insulative material; the second stack not being over the steps;

forming a second fill material over the first fill material and adjacent the second stack;

removing the first sacrificial material and forming conductive layers within the first and third levels; the conductive layers within the steps having upper surfaces;

forming second openings to extend through the second fill material to the second sacrificial material;

extending the second openings through the second sacrificial material and the etch-stop material to the upper surfaces of the conductive layers within the steps; and forming conductive interconnects within the extended second openings.

2. The method of claim 1 wherein the conductive layers are gate/routing layers of a memory array, and further comprising coupling the conductive interconnects with driver circuitry.

3. The method of claim 1 further comprising forming a protective liner over the stack, and forming the etch-stop material over the protective liner.

4. The method of claim 3 wherein the protective liner comprises an insulative oxide.

5. The method of claim 3 wherein the protective liner comprises one or more of SiO, AlO, HfO, ZrO, and TaO; where the chemical formulas indicate primary constituents rather than specific stoichiometries.

6. The method of claim 1 wherein the first and second fill materials are different compositions relative to one another.

7. The method of claim 1 wherein the first and second fill materials are a same composition as one another.

8. The method of claim 7 wherein the first and second fill materials comprise silicon dioxide.

9. The method of claim 1 wherein the etch-stop material is insulative.

10. The method of claim 1 wherein the etch-stop material is conductive.

11. The method of claim 1 wherein the etch-stop material comprises aluminum oxide.

12. The method of claim 1 wherein the etch-stop material comprises carbon-doped silicon nitride.

13. The method of claim 1 wherein the etch-stop material consists essentially of silicon.

14. The method of claim 1 wherein the etch-stop material comprises tungsten.

15. A method of forming an integrated assembly, comprising:

forming a first stack of alternating first and second levels; the first stack having a first region within a memory array region, and having a second region within a staircase region proximate the memory array region; the first levels comprising a first sacrificial material and the second levels comprising an insulative material; at least some of the first and second levels being configured as steps within the staircase region;

each of the steps comprising one of the second levels over an associated one of the first levels, and having an upper surface corresponding to an upper surface of said one of the second levels;

forming a protective liner over the second region of the first stack;

forming an etch-stop material over the second region of the first stack and over the protective liner;

forming a first fill material over the steps, the first fill material being over the etch-stop material;

forming first openings to extend through the first fill material to the etch-stop material;

forming a second sacrificial material within the first openings;

forming a second stack over the first stack; the second stack having alternating third and fourth levels; the third levels comprising the first sacrificial material and the fourth levels comprising the insulative material; the second stack having a third region within the memory array region, and having a fourth region within the staircase region; the second stack not being over the steps;

forming a second fill material over the first fill material and adjacent the second stack within the staircase region;

removing the first sacrificial material and forming conductive material within the first and third levels; the conductive material within the steps being configured as conductive layers having upper surfaces;

forming second openings to extend through the second fill material to the second sacrificial material;

extending the second openings through the second sacrificial material, the etch-stop material and the protective liner to the upper surfaces of the conductive layers within the steps; and forming conductive interconnects within the extended second openings.

16. The method of claim 15 wherein the first sacrificial material comprises silicon nitride.

17. The method of claim 15 wherein the second sacrificial material comprises one or more of aluminum oxide, silicon and tungsten.

18. The method of claim 15 further comprising forming a planarized upper surface to extend across the first stack and the first fill material prior to forming the first openings.

19. The method of claim 15 further comprising forming a planarized upper surface to extend across the first stack, the first fill material and the second sacrificial material.

20. The method of claim 15 further comprising forming channel material to extend through the first and second stacks within the memory array region.

21. The method of claim 20 further comprising forming charge-trapping material to be adjacent the channel material.

22. The method of claim 15 wherein dielectric blocking material is formed within the first and third levels in addition to the conductive material; and wherein the extending of the second openings also includes extending the second openings through the dielectric barrier material.

* * * * *